(12) United States Patent
Choi

(10) Patent No.: US 12,464,878 B2
(45) Date of Patent: Nov. 4, 2025

(54) LIGHT EMITTING MODULE AND DISPLAY DEVICE INCLUDING THE SAME

(71) Applicant: SEOUL VIOSYS CO., LTD., Ansan-si (KR)

(72) Inventor: Jae Young Choi, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 386 days.

(21) Appl. No.: 18/303,945

(22) Filed: Apr. 20, 2023

(65) Prior Publication Data
US 2023/0369553 A1    Nov. 16, 2023

Related U.S. Application Data

(60) Provisional application No. 63/424,624, filed on Nov. 11, 2022, provisional application No. 63/333,607, filed on Apr. 22, 2022.

(51) Int. Cl.
*H10H 20/857* (2025.01)
*H01L 25/075* (2006.01)
*H10H 20/82* (2025.01)
*H10H 20/855* (2025.01)

(52) U.S. Cl.
CPC ....... *H10H 20/857* (2025.01); *H01L 25/0753* (2013.01); *H10H 20/82* (2025.01); *H10H 20/855* (2025.01)

(58) Field of Classification Search
CPC .... H10H 20/857; H10H 20/82; H10H 20/855; H10H 20/854; H10H 20/856; H10H 20/831; H01L 25/0753
See application file for complete search history.

(56) References Cited

U.S. PATENT DOCUMENTS

| | | | | |
|---|---|---|---|---|
| 5,514,838 A | * | 5/1996 | Wen | H01L 24/10 361/767 |
| 2002/0163077 A1 | * | 11/2002 | Kuwahara | H01L 25/0657 257/723 |
| 2007/0272930 A1 | * | 11/2007 | Tseng | H10H 20/82 257/E33.072 |

(Continued)

FOREIGN PATENT DOCUMENTS

| | | | | |
|---|---|---|---|---|
| CN | 1661821 A | * | 8/2005 | .......... H10H 20/857 |
| CN | 109671834 B | * | 7/2021 | .......... H10H 20/857 |

(Continued)

OTHER PUBLICATIONS

International Search Report from PCT Application No. PCT/KR2023/005557 dated Jul. 27, 2023, (3 pages).

*Primary Examiner* — Mohammed Shamsuzzaman
(74) *Attorney, Agent, or Firm* — Perkins Coie LLP

(57) ABSTRACT

According to an aspect of the present disclosure, there may be provided a light emitting diode module, including: a light emitting diode configured to irradiate light; a conductive pattern layer electrically connected to the light emitting diode; and a cover layer disposed on the conductive pattern layer and electrically insulated, wherein the cover layer is disposed between the light emitting diode and the conductive pattern layer to have a region that at least a portion of the cover layer overlaps with the light emitting diode when viewed from above the light emitting diode.

17 Claims, 19 Drawing Sheets

(56) References Cited

U.S. PATENT DOCUMENTS

| | | | | |
|---|---|---|---|---|
| 2008/0135869 A1* | 6/2008 | Liu | ............... | H10H 20/8506 |
| | | | | 257/E33.058 |
| 2008/0160183 A1* | 7/2008 | Ide | ................... | H01L 24/37 |
| | | | | 252/500 |
| 2009/0096100 A1* | 4/2009 | Kajiwara | ........... | H01L 24/29 |
| | | | | 252/512 |
| 2010/0195292 A1* | 8/2010 | Ide | ................... | H01L 25/50 |
| | | | | 174/257 |
| 2016/0254429 A1* | 9/2016 | Fujikawa | ......... | H01L 25/0753 |
| | | | | 257/88 |
| 2020/0066943 A1* | 2/2020 | Tamura | .......... | H01L 25/0753 |

FOREIGN PATENT DOCUMENTS

| | | | | | |
|---|---|---|---|---|---|
| JP | 2012-109501 | A | | 6/2012 | |
| JP | 5331929 | B2 | * | 10/2013 | |
| KR | 1020120121704 | A | | 11/2012 | |
| KR | 20160054712 | A | * | 5/2016 | ........... H10H 20/819 |
| KR | 10-1709781 | B1 | | 2/2017 | |
| KR | 20190087249 | A | * | 7/2019 | ........... H01L 33/483 |
| KR | 10-2019-0097739 | A | | 8/2019 | |
| TW | 201701739 | A | * | 1/2017 | ........... H05K 3/4679 |
| WO | WO-2017010818 | A1 | * | 1/2017 | ........... H10H 20/857 |
| WO | WO-2017191923 | A1 | * | 11/2017 | ......... H01L 25/0753 |

\* cited by examiner

B

LIGHT EMITTING MODULE AND DISPLAY DEVICE INCLUDING THE SAME

CROSS REFERENCE TO RELATED APPLICATIONS

This application claims priority to and the benefit of U.S. Provisional Application No. 63/333,607, filed on Apr. 22, 2022, and U.S. Provisional Application No. 63/424,624, filed on Nov. 11, 2022, the disclosures of which are hereby incorporated by reference for all purposes as if fully set forth herein.

TECHNICAL FIELD

The present disclosure relates to a light emitting module and a display device including the same.

BACKGROUND OF INVENTION

In general, a light emitting diode (LED) is a device that converts electrical energy into light. The light emitting diodes are widely used in various light sources such as backlights, lighting, signals, displays, and the like, and may be used in a package form together with a circuit board.

Meanwhile, the light emitting diode may be mounted on a circuit board through solder or the like. However, when the distance between the light emitting diode and the circuit board is long, it is difficult to fix the light emitting diode at an accurate position on the circuit board as the amount of solder increases.

CONTENTS OF INVENTION

Problems to be Solved by Invention

In view of the above, one embodiment of the present disclosure provides a light emitting diode module capable of fixing a light emitting diode at an accurate position on a circuit board by minimizing the distance between the light emitting diode and the circuit board.

Means for Solving Problems

In accordance with an aspect of the present disclosure, there may be provided a light emitting diode module, including: a light emitting diode configured to irradiate light; a conductive pattern layer electrically connected to the light emitting diode; and a cover layer disposed on the conductive pattern layer and electrically insulated, wherein the cover layer is disposed between the light emitting diode and the conductive pattern layer to have a region that at least a portion of the cover layer overlaps with the light emitting diode when viewed from above the light emitting diode.

Further, there may be provided the light emitting diode module, wherein the light emitting diode includes a light transmitting layer, a light emitting structure disposed on the light transmitting layer, and an electrode layer electrically connected to the conductive pattern layer, wherein the light emitting structure includes a first conductivity-type semiconductor layer, a second conductivity-type semiconductor layer positioned on the first conductivity-type semiconductor layer, and an active layer positioned between the first conductivity-type semiconductor layer and the second conductivity-type semiconductor layer, and wherein the cover layer is disposed to have a region that at least a portion thereof overlaps between the light transmitting layer and the electrode layer when viewed from above the light emitting diode.

Further, there may be provided the light emitting diode module, wherein the cover layer includes a first cover part and a second cover part forming a step with the first cover part, and wherein the electrode layer is disposed so as not to overlap with the first cover part when viewed from above.

Further, there may be provided the light emitting diode module, wherein the cover layer is disposed to have a region that at least a portion thereof overlaps between the light transmitting layer and the first conductivity-type semiconductor layer when viewed from above the light emitting diode.

Further, there may be provided the light emitting diode module, wherein a roughness of a portion of an upper surface of the first cover part that does not overlap with the second cover part is smaller than a roughness of a lower surface of the first cover part.

Further, there may be provided the light emitting diode module, wherein at least one of the first cover part and the second cover part includes a reflective material to reflect light emitted from the light emitting diode.

Further, there may be provided the light emitting diode module, wherein at least some of corners of the cover layer have a curved shape.

Further, there may be provided the light emitting diode module, wherein the second cover part is disposed on the first cover part, and wherein a thicknesses of the first cover part and a thickness of the second cover part are different from each other.

Further, there may be provided the light emitting diode module, further including a solder disposed between the electrode layer and the conductive pattern layer to fix the light emitting diode to the conductive pattern layer, wherein a through-hole exposing the conductive pattern layer toward the light emitting diode is formed in the first cover part, and wherein at least a portion of the solder is disposed in the through-hole.

Further, there may be provided the light emitting diode module, wherein the solder has a first solder side surface and a second solder side surface which are formed on opposite sides, and wherein the first solder side surface and the second solder side surface are inclined with respect to the conductive pattern layer such that angles formed by each of the first solder side surface and the second solder side surface with respect to the conductive pattern layer are different from each other.

Further, there may be provided the light emitting diode module, wherein the solder has a first solder side surface and a second solder side surface formed on opposite sides, and wherein the first solder side and the second solder side are curved so that curvatures thereof are different from each other.

Further, there may be provided the light emitting diode module, wherein a communication hole having a smaller width than the through-hole is formed at a position corresponding to the through-hole in the conductive pattern layer, and wherein at least a portion of the solder is disposed within the communication hole.

Further, there may be provided the light emitting diode module, wherein the light emitting diode includes an electrode layer to be electrically connected to the conductive pattern layer, wherein the conductive pattern layer includes a first conductive layer and a second conductive layer disposed on the first conductive layer, and wherein the electrode layer is disposed on the second conductive layer.

Further, there may be provided the light emitting diode module, wherein the cover layer is disposed on the first conductive layer so as not to overlap with the second conductive layer when viewed from above.

Further, there may be provided the light emitting diode module, wherein the light emitting diode includes an electrode layer to be electrically connected to the conductive pattern layer, wherein the conductive pattern layer includes a first conductive part, and a second conductive part integrally formed with the first conductive part and extending upward from an upper surface of the first conductive part, and wherein the electrode layer is disposed on the second conductive part.

Further, there may be provided the light emitting diode module, wherein the cover layer is disposed on the first conductive part so as not to overlap with the second conductive part when viewed from above.

Further, there may be provided the light emitting diode module, wherein when viewed from above, a ratio of an area of an overlapping portion of the light emitting diode and the cover layer to an area of the light emitting diode is 2% to 8% inclusive.

Further, there may be provided the light emitting diode module, wherein the cover layer includes a photo solder resist (PSR), and the PSR includes at least one of epoxy, silicone, acrylate and barium sulfate.

Further, there may be provided a display device including a frame; a light emitting diode module disposed on the frame; an optical unit disposed above the frame; and a power supply unit supplying power to the light emitting diode module, wherein the light emitting diode module includes: a light emitting diode configured to irradiate light; a conductive pattern layer electrically connected to the light emitting diode; and a cover layer disposed on the conductive pattern layer and electrically insulated, and wherein the cover layer is disposed between the light emitting diode and the conductive pattern layer so that at least a portion of the cover layer is placed directly below the light emitting diode.

Further, there may be provided a display device including a frame; a light emitting diode module disposed on the frame; an optical unit disposed above the frame; and a power supply unit supplying power to the light emitting diode module, wherein the light emitting diode module including: a light emitting diode configured to irradiate light; a conductive pattern layer electrically connected to the light emitting diode; and a cover layer disposed on the conductive pattern layer and electrically insulated, and wherein the cover layer is disposed between the light emitting diode and the conductive pattern layer so that at least a portion of the cover layer has a region overlapping with the light emitting diode.

Effects of Invention

According to one embodiment of the present disclosure, the light emitting diode can be fixed at an accurate position on the circuit board by minimizing the distance between the light emitting diode and the circuit board.

SPECIFIC CONTENTS FOR EMBODYING INVENTION

Hereinafter, specific embodiments for implementing a spirit of the present disclosure will be described in detail with reference to the drawings.

In describing the present disclosure, detailed descriptions of known configurations or functions may be omitted to clarify the present disclosure.

When an element is referred to as being 'connected to' or 'supported' by another element, it should be understood that the element may be directly connected to, or supported by another element, but that other elements may exist in the middle.

The terms used in the present disclosure are only used for describing specific embodiments, and are not intended to limit the present disclosure. Singular expressions include plural expressions unless the context clearly indicates otherwise.

Terms including ordinal numbers, such as first and second, may be used for describing various elements, but the corresponding elements are not limited by these terms. These terms are only used for the purpose of distinguishing one element from another element.

In the present specification, it is to be understood that the terms such as "including" are intended to indicate the existence of the certain features, areas, integers, steps, actions, elements, combinations, and/or groups thereof disclosed in the specification, and are not intended to preclude the possibility that one or more other certain features, areas, integers, steps, actions, elements, combinations, and/or groups thereof may exist or may be added. Further, in the present disclosure, it is to be noted that expressions, such as the upper surface and the lower surface, are described based on the illustration of drawings, but may be modified if directions of corresponding objects are changed.

Figure 1:
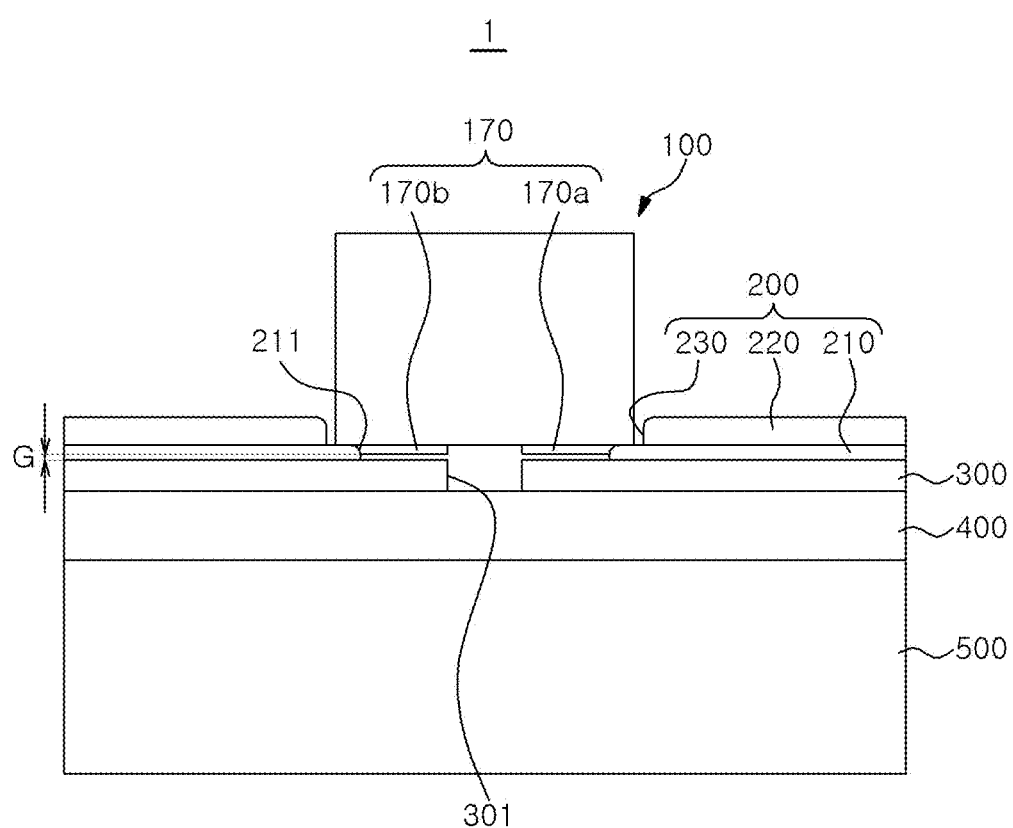
FIG. 1 is a view showing a light emitting diode module according to a first embodiment of the present disclosure.
Figure 2:
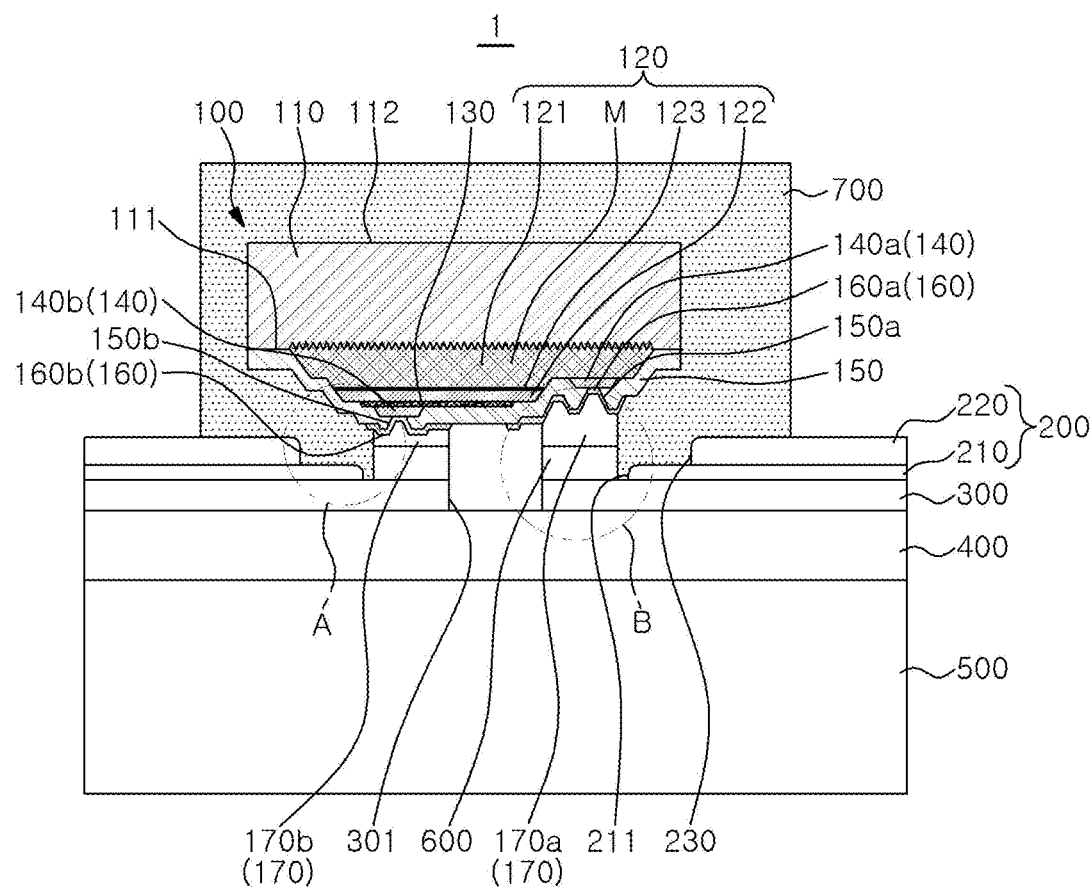
FIG. 2 is a view showing a state in which solder is further included in the light emitting diode module of FIG. 1.

Hereinafter, a specific configuration of a light emitting diode module 1 according to the present disclosure will be described with reference to the drawings. Referring to FIGS. 1 and 2, the light emitting diode module 1 according to a first embodiment of the present disclosure can receive power from the outside and emit light. The light emitting diode module 1 may include a light emitting diode 100, a cover layer 200, a conductive pattern layer 300, an insulating layer 400, a substrate 500, and a solder 600.

The light emitting diode 100 may generate light. For example, the light emitting diode 100 may generate light in an ultraviolet wavelength band and light in a visible ray wavelength band. The light emitting diode 100 may have a long rectangular shape having a major axis and a minor axis, and may be a small light emitting diode having a relatively small horizontal sectional area. For example, when the light emitting diode 100 has a rectangular shape, a length in longitudinal direction of the light emitting diode 100 may be less than twice a length in transverse direction. However, the light emitting diode 100 is not limited to the above and may have various shapes.

The light emitting diode 100 may be disposed on the substrate 500 and fixed at a specific position on the substrate 500 through the solder 600. For example, a plurality of light emitting diodes 100 may be provided, and the plurality of light emitting diodes 100 may be arranged on the substrate 500 in a predetermined pattern. In addition, the light emitting diode 100 may be electrically connected to the substrate 500 through the conductive pattern layer 300. The light emitting diode 100 may have a size of 1 mm$^2$ or less, and for example, may have a size of 480 μm×480 μm to 550 μm×550 μm inclusive. The light emitting diode 100 may include a light transmitting layer 110, a light emitting structure 120, an ohmic layer 130, a contact layer 140, an insulation layer 150, a bump layer 160, and an electrode layer 170. If necessary, the ohmic layer 130 and the contact layer 140 may be formed as one.

The light transmitting layer 110 may be an insulating or conductive substrate. The light transmitting layer 110 may be a growth substrate for growing the light emitting structure 120, and may include, for example, a sapphire substrate, a silicon carbide substrate, a silicon substrate, a gallium nitride substrate, an aluminum nitride substrate, and the like. The light transmitting layer 110 may have a light incident surface 111 and a light exit surface 112.

The light incident surface 111 is one surface of both surfaces of the light transmitting layer 110, which faces the light emitting structure 120, and may be a surface on which light is incident from the light emitting structure 120 to the light transmitting layer 110. The light incident surface 111 may be a flat surface, but is not limited thereto. For example, the light transmitting layer 110 may have an uneven pattern in at least a portion of the light incident surface 111 facing the light emitting structure 120. The uneven pattern formed on the light transmitting layer 110 may include a plurality of protrusions, and the plurality of protrusions may be formed in a regular or irregular pattern. In addition, some of the plurality of protrusions on a lower surface of the light transmitting layer 110 may be positioned between the light emitting structure 120 and the light transmitting layer 110.

The plurality of protrusions can improve extraction efficiency of light emitted from the light emitting structure 120.

In addition, the light exit surface 112 may be a surface opposite to the light incident surface 111 of both surfaces of the light transmitting layer 110, and may be a surface through which light is emitted from the light transmitting layer 110. The light transmitting layer 110 may include an antireflection region on the light exit surface 112. In addition, an anti-glare layer may be included on the light exit surface 112 of the light transmitting layer 110. For example, the light transmitting layer 110 may have a thickness of 30 μm to 300 μm, but is not limited thereto. In addition, the light transmitting layer 110 of the present disclosure may serve as a transparent substrate, and when applied to a transparent display, the light transmitting layer 110 may include a circuit for electrical connection with the light emitting structure 120.

Meanwhile, a side surface of the light transmitting layer 110 has an arbitrary angle and has a plurality of side surfaces extending from an upper surface to the lower surface of the light transmitting layer 110. At least two of the plurality of side surfaces may extend at different angles from the lower or upper surface of the light transmitting layer 110. In addition, at least one side surface of the light transmitting layer 110 may include a region having different inclination angles between an upper portion and a lower portion, and the light transmitting layer 110 may include a roughened surface on the side surface. By forming the inclined surface or the roughened surface on one surface of the light transmitting layer 110, the light-emitting efficiency of light emitted from the light emitting structure 120 can be improved.

The light emitting structure 120 may generate light. The light emitting structure 120 is positioned on the light transmitting layer 110. In addition, the light emitting structure 120 may have a rectangular shape having a major axis and a minor axis similar to the light transmitting layer 110, but is not limited thereto and may have various shapes. Further, the total thickness of the light emitting structure 120 may be within a range of 1 to 10 μm. The area of the upper surface of the light emitting structure 120 is smaller than the area of the lower surface of the light transmitting layer 110, and the lower surface of the light transmitting layer 110 may be exposed along the periphery of the light emitting structure 120. In addition, the lower surface of the light transmitting layer 110 of the same width may be exposed on both sides of the light emitting structure 120, but is not necessarily limited thereto. For example, a width of the lower surface of the light transmitting layer 110 exposed in one direction may be in a range of 6:1 to 10:1 with respect to a length of the light transmitting layer 110 in one direction. In other words, the ratio of the width of the light transmitting layer 110 exposed in the longitudinal direction to the length of the light transmitting layer 110 in the longitudinal direction may be about ⅒ to about ⅙, and the ratio of the width of the light transmitting layer 110 exposed in the transverse direction to the length of the light transmitting layer 110 in the transverse direction may also be about ⅒ to about ⅙.

The light emitting structure 120 may include a first conductivity-type semiconductor layer 121, a second conductivity-type semiconductor layer 122 positioned on the first conductivity-type semiconductor layer 121, and an active layer 123 positioned between the first conductivity-type semiconductor layer 121 and the second conductivity-type semiconductor layer 122.

The first conductivity-type semiconductor layer 121 may have an inclined side surface. An inclination angle of the inclined side surface of the first conductivity-type semiconductor layer 121 may be as gentle as about 60 degrees or less with respect to the lower surface of the light transmitting layer 110. In this case, by gently forming the side surface of the first conductivity-type semiconductor layer 121, defects such as cracks may be prevented from occurring in the first insulating reflective layer covering the light emitting structure 120 and the light transmitting layer 110. In addition, the second conductivity-type semiconductor layer 122 may be disposed on the first conductivity-type semiconductor layer 121. Meanwhile, the first conductivity-type semiconductor layer 121 may include n-type impurities (e.g., Si, Ge, Sn, Te), and the second conductivity-type semiconductor layer 122 may include p-type impurities (e.g., Mg, Sr, Ba). For example, the first conductivity-type semiconductor layer 121 may include GaN, AlGaN, GaAs, GaP, InGaP, GaAlP, InAlP, or InGaAlP including Si as a dopant, and the second conductivity-type semiconductor layer 122 may include GaN, AlGaN, GaAs, GaP, InGaP, GaAlP, InAlP, or InGaAlP including Mg as a dopant. In this case, in the present embodiment, the first conductivity-type semiconductor layer 121 may be an n-type semiconductor layer, and the second conductivity-type semiconductor layer 122 may be a p-type semiconductor layer. However, this is only an example, and the first conductivity-type semiconductor layer 121 may include p-type impurities, and the second conductivity-type semiconductor layer 122 may include n-type impurities. Moreover, although the first conductivity-type semiconductor layer 121 is shown as a single layer in the drawings, this is only an example and may be formed of multiple layers or may include a superlattice layer.

The active layer 123 may include a well layer and a barrier layer as a multi-quantum well (MQW) structure, and the composition ratio or bandgap energy of the well layer may be adjusted to emit a desired wavelength. For example, the active layer 123 may emit red light, green light, blue light, or ultraviolet light according to the semiconductor material forming the layer and its composition ratio. The active layer 123 may be positioned between the first conductivity-type semiconductor layer 121 and the second conductivity-type semiconductor layer 122.

The first conductivity-type semiconductor layer 121, the second conductivity-type semiconductor layer 122, and the active layer 123 may include a III-V series semiconductor such as a nitride-based semiconductor (Al, Ga, In).

Meanwhile, the light emitting structure 120 may include a mesa M including the second conductivity-type semiconductor layer 122 and the active layer 123. In other words, the second conductivity-type semiconductor layer 122 and the active layer 123 included in the light emitting structure 120 may form a mesa M. In addition, the mesa M may further include at least a portion of the first conductivity-type semiconductor layer 121. The mesa M may be positioned on a partial region of the first conductivity-type semiconductor layer 121, and the mesa M may have a thickness within a range of approximately 1 to 2 µm. In the present embodiment, a portion of the first conductivity-type semiconductor layer 121 may be exposed outside the mesa M. Moreover, in some regions, an inclined surface of the mesa M is parallel to the inclined surface of the first conductivity-type semiconductor layer 121, and accordingly, the exposed surface of the upper surface of the first conductivity-type semiconductor layer 121 may be limited to one side of the mesa M. However, the present embodiment is not limited thereto, and the lower surface of the first conductivity-type semiconductor layer 121 may be exposed along the periphery of the mesa M. In another embodiment, a through-hole or a groove may be formed inside the mesa M to expose the first conductivity-type semiconductor layer 121.

The mesa M may have a rectangular shape with a portion removed to expose the first conductivity-type semiconductor layer 121. In addition, the mesa M may have an inclined side surface, and the inclined angle of the side surface may be gentle to about 45 degrees or less with respect to a bottom surface of the light transmitting layer 110. Further, when the side surfaces of the first conductivity-type semiconductor layer 121 and the mesa M are parallel, the first conductivity-type semiconductor layer 121 and the mesa M may form the same inclined surface. The light emitting structure 120 may be formed by forming the mesa M through an etching process after sequentially growing the first conductivity-type semiconductor layer 121, the active layer 123, and the second conductivity-type semiconductor layer 122 on the light transmitting layer 110, and then by patterning the first conductivity-type semiconductor layer 121 to expose the light transmitting layer 110. When viewed from the up-down direction, the first conductivity-type semiconductor layer 121 and the mesa M may be divided into a region in which they overlap with each other and a region in which they do not overlap each other. In this case, light may be emitted through the region where the first conductivity-type semiconductor layer 121 and the mesa M do not overlap. For example, the region where the first conductivity-type semiconductor layer 121 and the mesa M overlap with each other may be larger than the region where the first conductivity-type semiconductor layer 121 and the mesa M do not overlap with each other.

The ohmic layer 130 may make ohmic contact with the first conductivity-type semiconductor layer 121 or the second conductivity-type semiconductor layer 122. The ohmic layer 130 may be disposed on the second conductivity-type semiconductor layer 122. In addition, the ohmic layer 130 may be formed as a single layer or multiple layers, and may be formed as a transparent electrode. For example, the transparent electrode of the ohmic layer 130 may include a light-transmitting conductive oxide layer such as ITO (Indium Tin Oxide), ZnO (Zinc Oxide), ZITO (Zinc Indium Tin Oxide), ZIO (Zinc Indium Oxide), ZTO (Zinc Tin Oxide), GITO (Gallium Indium Tin Oxide), GIO (Gallium Indium Oxide), GZO (Gallium Zinc Oxide), AZO (Aluminum doped Zinc Oxide), FTO (Fluorine Tin Oxide), and the like. Conductive oxides may include various dopants.

The transparent electrode of the ohmic layer 130 including such a light-transmitting conductive oxide has excellent ohmic contact characteristics with the second conductivity-type semiconductor layer 122. In other words, since a conductive oxide such as ITO or ZnO has a relatively lower contact resistance with the second conductivity-type semiconductor layer 122 than a metallic electrode, by applying a transparent electrode including the conductive oxide, a forward voltage Vf of the light emitting diode 100 can be reduced, which improves light emitting efficiency. When the size of the light emitting diode 100 is miniaturized, the current density is relatively low and thus the ohmic characteristics are greatly affected. Accordingly, the light emitting efficiency can be more effectively improved by improving the ohmic characteristics using the transparent electrode.

In addition, the conductive oxide is less likely to be peeled from the nitride-based semiconductor layer than a metallic electrode, and is stable even when used for a long time. Accordingly, the reliability of the light emitting diode chip can be improved by using the transparent electrode containing the conductive oxide. The thickness of the transparent electrode is not limited, but the transparent electrode may have a thickness within a range of about 400 Å to 3000 Å. When the thickness of the transparent electrode is excessively thick, light passing through the transparent electrode may be absorbed and loss may occur. Accordingly, the thickness of the transparent electrode is limited to 3000 Å or less. Since the transparent electrode is formed to substantially entirely cover the upper surface of the second conductivity-type semiconductor layer 122, current dissipation efficiency when driving the light emitting diode 100 can be improved. For example, side surfaces of the transparent electrode may be formed along side surfaces of the mesa M. The transparent electrode may be formed on the second conductivity-type semiconductor layer 122 after forming the light emitting structure 120, or may be formed on the second conductivity-type semiconductor layer 122 in advance before mesa etching.

The contact layer 140 may be electrically connected to the ohmic layer 130 and the bump layer 160. The contact layer 140 may include a first contact pad 140a and a second contact pad 140b.

The first contact pad 140a may be electrically connected to the first conductivity-type semiconductor layer 121 and a first bump pad 160a to be described later. The first contact pad 140a may make ohmic contact with a region of the first conductivity-type semiconductor layer 121 that does not overlap with the mesa M. In addition, the first contact pad 140a may include an ohmic metal layer making ohmic contact with the first conductivity-type semiconductor layer 121. The first contact pad 140a may be disposed so as not to overlap with the second conductivity-type semiconductor layer 122 and the active layer 123. In this case, the insulation layer 150 for insulating the first contact pad 140a from the second conductivity-type semiconductor layer 122 may be omitted. Meanwhile, the first contact pad 140a may be separated from the mesa M by a sufficient distance in the horizontal direction, and the separation distance may be greater than the thickness of the insulation layer 150. However, when the separation distance between the first contact pads 140a is excessively large, the light emitting area decreases, so the separation distance may be smaller than the diameter of the first contact pad 140a.

The second contact pad 140b may be electrically connected to the ohmic layer 130 and a second bump pad 160b to be described later. The second contact pad 140b may be electrically connected to the ohmic layer 130. In addition, the second contact pad 140b may be spaced apart from the first contact pad 140a. Moreover, the second contact pad 140b may be formed on the mesa M to which the ohmic layer 130 is connected by, for example, a lift-off process.

The insulation layer 150 may cover at least a portion of the first conductivity-type semiconductor layer 121, the active layer 123, the second conductivity-type semiconductor layer 122, the first contact pad 140a, and the second contact pad 140b. The insulation layer 150 covers the lower region and the side surface of the mesa M, and covers the first conductivity-type semiconductor layer 121 exposed around the mesa M and the side surface of the first conductivity-type semiconductor layer 121. In addition, the insulation layer 150 covers at least a portion of the lower surface of the light transmitting layer 110 exposed around the first conductivity-type semiconductor layer 121, and covers a region between the contact layer 140 and the mesa M.

In one embodiment of the present disclosure, the insulation layer 150 may be formed to cover almost the entire surface except for a partial area of the second contact pad 140b and a partial area of the first contact pad 140a. The insulation layer 150 may have a plurality of openings 150a and 150b each of which has a size smaller than the area of the contact layer 140 and is restrictively positioned on the contact layer 140. That is, the insulation layer 150 may have a first opening 150a and a second opening 150b which expose the first contact pad 140a and the second contact pad 140b, respectively. The first opening 150a and the second opening 150b of the insulation layer 150 may have different widths. The first opening 150a and the second opening 150b of the insulation layer 150 may have different areas. In addition, the first opening 150a and the second opening 150b of the insulation layer 150 may have different shapes. The width of the first opening 150a of the insulation layer 150 may be greater than a distance between the first contact pad 140a and the adjacent mesa M in the horizontal direction. Moreover, the insulation layer 150 may be formed to have a thickness different from that of the first contact pad 140a or the second contact pad 140b. For example, the insulation layer 150 may be formed thicker than the first contact pad 140a or the second contact pad 140b, and have a thickness greater than 1.2 times that of the first contact pad 140a or the second contact pad 140b.

The insulation layer 150 includes a distributed Bragg reflector. The distributed Bragg reflector may be formed by repeatedly laminating dielectric layers having different refractive indices, and the dielectric layers may include one or more of $TiO_2$, $SiO_2$, $HfO_2$, $ZrO_2$, $Nb_2O_5$, and $MgF_2$. For example, the insulation layer 150 may have a structure of alternately laminated $TiO_2$ layer/$SiO_2$ layer. The distributed Bragg reflector is manufactured to reflect light generated in the active layer 123 and is formed in a plurality of pairs to improve reflectance. In the present embodiment, the distributed Bragg reflector may include 10 to 25 pairs. The insulation layer 150 may include an additional insulation layer 150 together with the distributed Bragg reflector. For example, the insulation layer 150 may include an interface layer positioned below the distributed Bragg reflector, and a protective layer covering the distributed Bragg reflector to improve adhesion between the distributed Bragg reflector and the underlying layer. For example the interface layer may be formed of a $SiO_2$ layer, and the protective layer may be formed of $SiO_2$ or SiNx.

The insulating layer 150 may have a thickness of about 2 μm to about 5 μm. The distributed Bragg reflector may have a reflectance of 90% or more for light generated in the active layer 123, and a reflectance close to 100% may be provided by controlling the type, thickness, and laminating cycle of the plurality of dielectric layers forming the distributed Bragg reflector. Moreover, the distributed Bragg reflector may have a high reflectance for visible light other than light generated in the active layer 123.

The bump layer 160 may be disposed on the contact layer 140. The bump layer 160 may include a first bump pad 160a and a second bump pad 160b.

The first bump pad 160a may contact the first contact pad 140a through the first opening 150a, and the second bump pad 140b may contact the second contact pad 140b through the second opening 150b. The first bump pad 160a and the second bump pad 160b may be spaced apart from each other by a predetermined distance or more on the mesa M. The separation distance between the first bump pad 160a and the second bump pad 160b may be, for example, 1.5 μm to 100 μm. In addition, the first bump pad 160a and the second bump pad 160b may be formed of the same material in the same process and may have the same layer structure. For example, the first bump pad 160a and the second bump pad 160b may be formed to contain a conductive material.

The electrode layer 170 is provided to transmit current to the bump layer 1160 and may be electrically connected to the conductive pattern layer 300. In addition, the solder 600 may be connected to the electrode layer 170, and the electrode layer 170 may be bonded to a specific position on the substrate 500 through the solder 600. For example, the electrode layer 170 may have a thickness of 5 µm or less. In this case, the thickness of the electrode layer 170 may be smaller than that of the insulation layer 150. In addition, the electrode layer 170 may have a thickness equal to or less than that of a first cover part 210 to be described later. Further, a predetermined gap G may be formed between the electrode layer 170 and the conductive pattern layer 300 in the up-down direction. Furthermore, a plurality of electrode layers 170 may be provided, and the plurality of electrode layers 170 may include a first electrode pad 170a and a second electrode pad 170b.

The first electrode pad 170a and the second electrode pad 170b may be supported on the bump layer 160 to be spaced apart in the horizontal direction. The first electrode pad 170a and the second electrode pad 170b may be connected to the first bump pad 160a and the second bump pad 160b, respectively. For example, the first electrode pad 170a and the second electrode pad 170b may have different poles. In addition, each of the first electrode pad 170a and the second electrode pad 170b may be connected to the conductive pattern layer 300 through the solder 600.

Although the light emitting diode 100 according to the first embodiment of the present disclosure has been described above, the light emitting diode 100 may further include layers having additional functions in addition to the described layers. For example, various layers such as a reflective layer (not shown) that reflects light, an additional insulating layer (not shown) for insulating a specific component, and a solder diffusion prevention layer (not shown) that prevents solder from spreading, and the like may be included in the light emitting diode 100.

Figure 3:
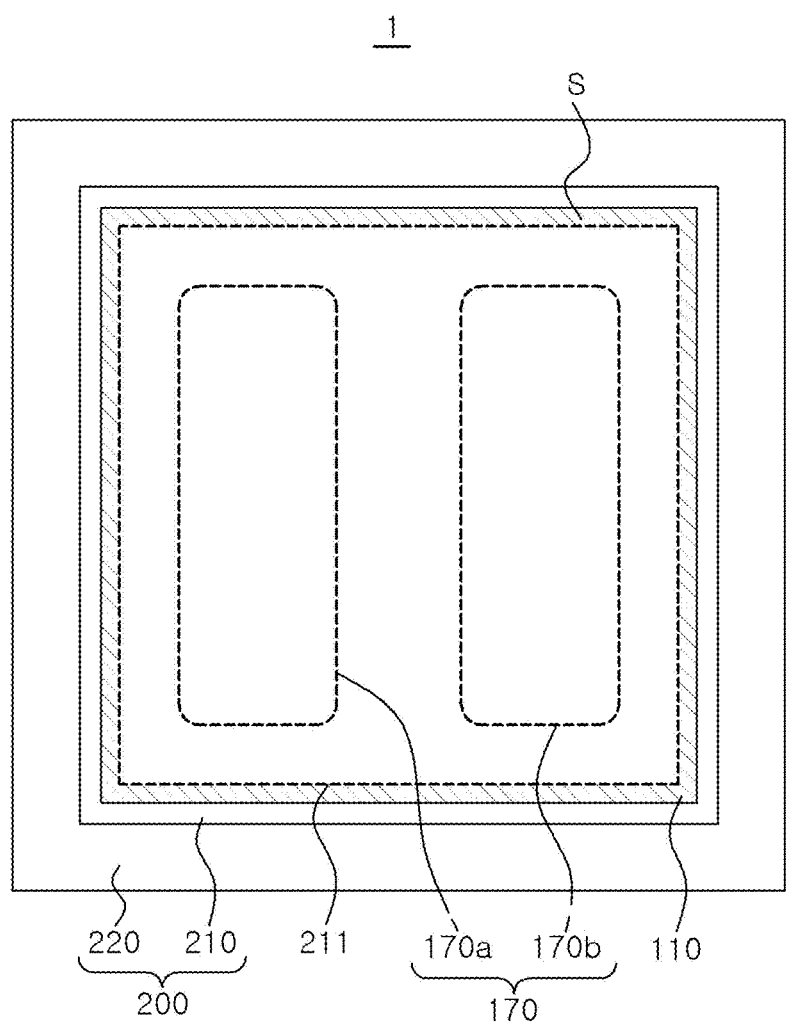
FIG. 3 is a plan view of the light emitting diode module shown in FIG. 1.

Referring to FIGS. 2 and 3, the cover layer 200 may be electrically insulated and may reflect light emitted from the light emitting diode 100. The cover layer 200 may be a light reflection layer that reflects light emitted from the light emitting diode 100. In addition, the cover layer 200 may be a light diffusion layer capable of diffusing light emitted from the light emitting diode 100. The cover layer 200 may be disposed on the conductive pattern layer 300 so as to be placed between the conductive pattern layer 300 and the light emitting diode 100 in the up-down direction. Moreover, the cover layer 200 may be provided to surround the light emitting diode 100 when viewed from the top of the light emitting diode 100, and may be disposed so as to overlap with at least a portion of the light emitting diode 100. In other words, at least a portion of the cover layer 200 may be disposed directly below the light emitting diode 100. In this case, at least a portion of the cover layer 200 may face the lower surface of the light emitting diode 100.

The cover layer 200 may have an overlapping region in a region between an outer periphery of the light transmitting layer 110 of the light emitting diode 100 and an outer periphery of the first conductivity-type semiconductor layer 121. In addition, the cover layer 200 may have an overlapping region adjacent to the electrode layer 170 of the light emitting diode 100. Moreover, the cover layer 200 may have an overlapping region in a region between the light transmitting layer 110 of the light emitting diode 100 and the electrode layer 170, and the outer periphery of the overlapping cover layer 200 may be placed adjacent to the edge of the electrode layer 170. In this case, the outer periphery of the cover layer 200 may be horizontally spaced apart from the electrode layer 170. For example, when the cover layer 200 is viewed from above, the ratio of an area S of the portion where the light emitting diode 100 and the cover layer 200 overlap with each other to an area of the light emitting diode 100 may be 1% to 15% inclusive, specifically 2% to 8% inclusive.

In addition, the cover layer 200 includes, for example, photo solder resist (PSR), and the PSR may include one or more of epoxy, silicon, acrylate, and barium sulfate. However, this is only an example, and any known material, which is electrically insulated and can reflect light, may be used as the cover layer 200. In addition, the cover layer 200 may have a thickness of 20 µm to 100 µm inclusive. The cover layer 200 may include a first cover part 210 and a second cover part 220.

Figure 4:
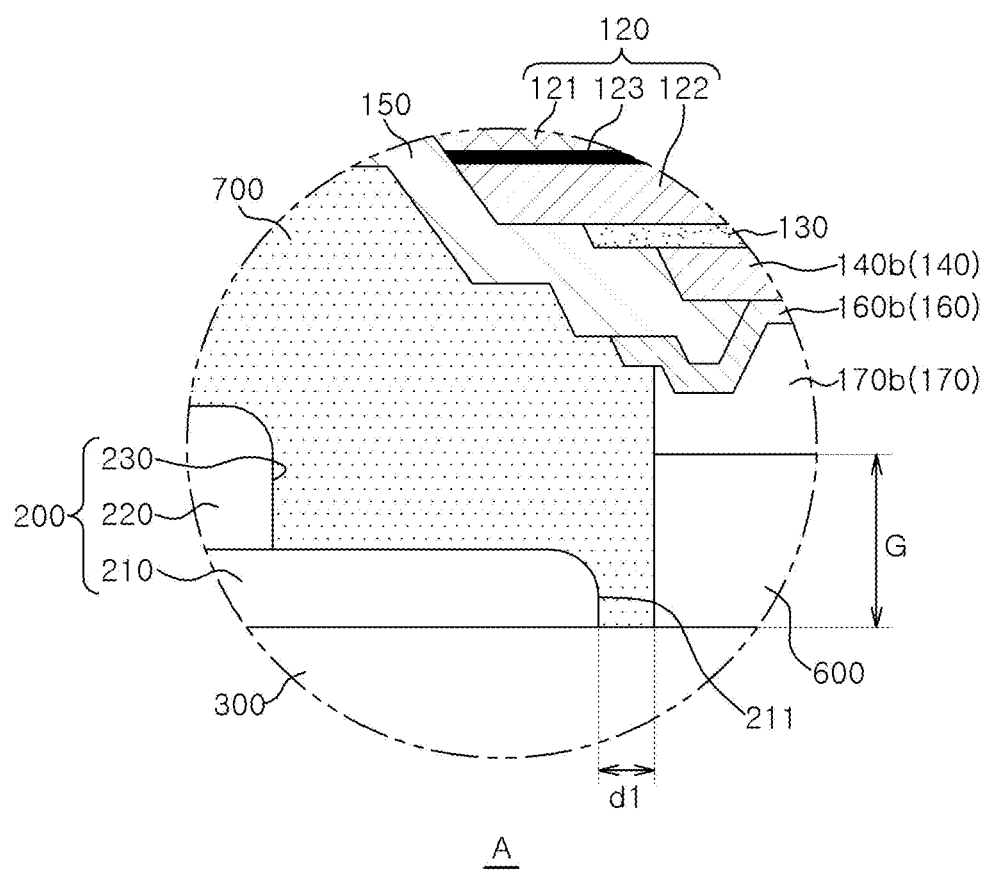
FIG. 4 is an enlarged view of part A of FIG. 2.

Referring to FIG. 4, the first cover part 210 may be disposed on the conductive pattern layer 300. After the first cover part 210 is coated on the conductive pattern layer 300, the conductive pattern layer 300 may be exposed through exposure and development processes. The conductive pattern layer 300 exposed by the first cover part 210 may be electrically connected to the electrode layer 170. When viewed from above the light emitting diode 100, the first cover part 210 may be disposed such that at least a portion thereof overlaps with the light emitting diode 100. For example, at least a portion of the first cover part 210 may be disposed below the light emitting diode 100 so that one end and the other end, which is opposite to one end, of the light emitting diode 100 may be caught on the first cover part 210. In addition, the first cover part 210 may be spaced apart from the electrode layer 170 by a predetermined distance d1 in the horizontal direction. However, this is only an example, and the first cover part 210 may be in contact with the electrode layer 170. Moreover, the first cover part 210 may be spaced apart from the light transmitting layer 110 by a predetermined distance d2 in the up-down direction. In other words, the first cover part 210 may be spaced downward from the light transmitting layer 110.

The upper and lower surfaces of the first cover part 210 may have different roughness. For example, the roughness of a portion of the upper surface of the first cover part 210 that does not overlap with the second cover part 220 may be smaller than the roughness of the lower surface of the first cover part 210 facing the conductive pattern layer 300. In addition, the first cover part 210 may have a thickness equal to or smaller than a thickness of the second cover part 220. The cover layer 200 may have a thickness equal to or greater than that of the electrode layer 170. Gap G may be formed between the electrode layer 170 and the conductive pattern layer 300 due to the thickness of the first cover part 210 of the cover layer 200, and as the difference between the thickness of the first cover part 210 and the thickness of the electrode layer 170 decreases, the gap G may also decrease.

Meanwhile, a through-hole 211 exposing the conductive pattern layer 300 toward the light emitting diode 100 may be formed in the first cover part 210. For example, the conductive pattern layer 300 exposed through the through-hole 211 may be electrically connected to the electrode layer 170 through the solder 600. The through-hole 211 may be formed in a central portion of the first cover part 210. For example, a width of the through-hole 211 may be 150 µm to 1000 µm inclusive, and an area of the through-hole 211 may be 80% or less of the area of the light emitting diode 100. In addition, the electrode layer 170 may be disposed inside the through-hole 211 or directly above the through-hole 211, and the solder 600 may be disposed within the through-hole 211. In this case, the first cover part 210 can prevent the solder 600 from spreading. In other words, when the solder 600 is disposed within the through-hole 211, the first cover part 210 may support side surfaces of the solder 600. In this case, the solder 600 may stably bond the electrode layer 170 and the conductive pattern layer 300 without spreading. In other words, the first cover part 210 may have an insulating property and a property of preventing the solder 600 from spreading.

Referring back to FIG. 2, the second cover part 220 may be disposed on the first cover part 210. In addition, the second cover part 220 may be arranged so as not to overlap with the light emitting diode 100 when viewed from above the light emitting diode 100. The second cover part 220 may have a thickness equal to or greater than that of the first cover part 210. For example, the second cover part 220 may have a thickness of 10 µm to 90 µm inclusive, and the first cover part 210 may have a thickness of 10 µm to 50 µm inclusive. The ratio of the thickness of the second cover part 220 to that of the first cover part 210 may be 0.5 to 9 inclusive.

The second cover part 220 may be integrally formed with the first cover part 210. For example, the second cover part 220 may include the same material as the first cover part 210. In this case, a boundary may not be formed between the second cover part 220 and the first cover part 210. However, this is only an example, and the second cover part 220 may further include a material different from that of the first cover part 210. In this case, a boundary may be formed between the second cover part 220 and the first cover part 210, and an adhesive layer (not shown) for increasing the adhesive force between the first cover part 210 and the second cover part 220 may be formed in the boundary region.

The second cover part 220 may form a step 230 with the first cover part 210. For example, the second cover part 220 may be formed on a region that does not overlap with the light emitting diode 100 when viewed from above in a state in which the first cover part 210 is formed thereon. In addition, a step may be formed as much as the thickness of the second cover part 220 formed, and a portion of the first cover part 210 may be exposed upward. In this case, the light transmitting layer 110 may be disposed above the exposed first cover part 210.

In addition, the gap G formed between the electrode layer 170 and the conductive pattern layer 300 may be minimized due to the step formed between the second cover part 220 and the first cover part 210. In other words, when the step is formed between the second cover part 220 and the first cover part 210, the gap G may be reduced by the thickness of the second cover part 220 compared to that when no step is formed between the second cover part 220 and the first cover part 210. In this case, the gap G between the electrode layer 170 and the conductive pattern layer 300 is reduced, and the amount of solder 600 is also reduced. Further, due to the decrease in solder amount, the probability that the light emitting diode 100 is fixed at the correct position on the board 500 increases, the defect rate decreases, and solder cost can be minimized. Furthermore, the reliability of the light emitting diode can be improved by minimizing the amount of solder in accordance with miniaturization of the light emitting diode 100 and the electrode layer 170 of the light emitting diode 100.

Meanwhile, the gap G may be generated by a difference in thickness between the first cover part 210 and the electrode layer 170. For example, if the thicknesses of the first cover part 210 and the electrode layer 170 are the same, the gap G is not generated. The thickness of the cover layer 200 may be thicker than the thickness of the electrode layer 170 in order to prevent a decrease in reflectance of the cover layer 200 and to secure the thickness of the cover layer 200, but is not limited thereto. In other words, the thickness of the first cover part 210 can be adjusted within a range where the reflectance of the cover layer 200 can be secured. If the thicknesses of the first cover part 210 and the electrode layer 170 are the same or similar, the gap G between the electrode layer 170 and the cover layer 200 can be minimized.

Meanwhile, at least a portion of the ends of the first cover part 210 and the second cover part 220 may have a curved shape. For example, at least a portion of the ends of the first cover part 210 and the second cover part 220 may have a round shape and may have a curvature of 10 or more. In addition, at least a portion of the end of the first cover part 210 and at least a portion of the end of the second cover part 220 may have different shapes and may have round shapes having different curvatures. However, this is just an example, and each of the ends of the first cover part 210 and the second cover part 220 may be formed to form an angle. Moreover, the ends of the first cover part 210 and the second cover part 220 may be formed to form different angles.

In addition, at least one of the first cover part 210 and the second cover part 220 may include a reflective material to reflect light emitted from the light emitting diode 100. For example, at least one of the first cover part 210 and the second cover part 220 may include one or more of Al, Ni, Ti, Ag, and Au. Further, the second cover part 220 may include a reflective material, and the first cover part 210 may not include a reflective material. In this case, the second cover part 220 may reflect the light traveling laterally from the light emitting diode 100 without absorbing it. However, this is just an example, and both the first cover part 210 and the second cover part 220 may include a reflective material. In this case, the thick portion of the cover layer 200 may have a higher reflectance than the thin portion of the cover layer 200. In other words, the portion where the first cover part 210 and the second cover part 220 overlap with each other may have a higher reflectance than the portion where the first cover part 210 and the second cover part 220 do not overlap with each other. Furthermore, the first cover part 210 may reflect light traveling downward from the light emitting diode 100, and the second cover part 220 may reflect light traveling laterally from the light emitting diode 100. The light efficiency of the light emitting diode module 1 can be improved by the light reflected from the first cover part 210 and the second cover part 220.

Figure 5:
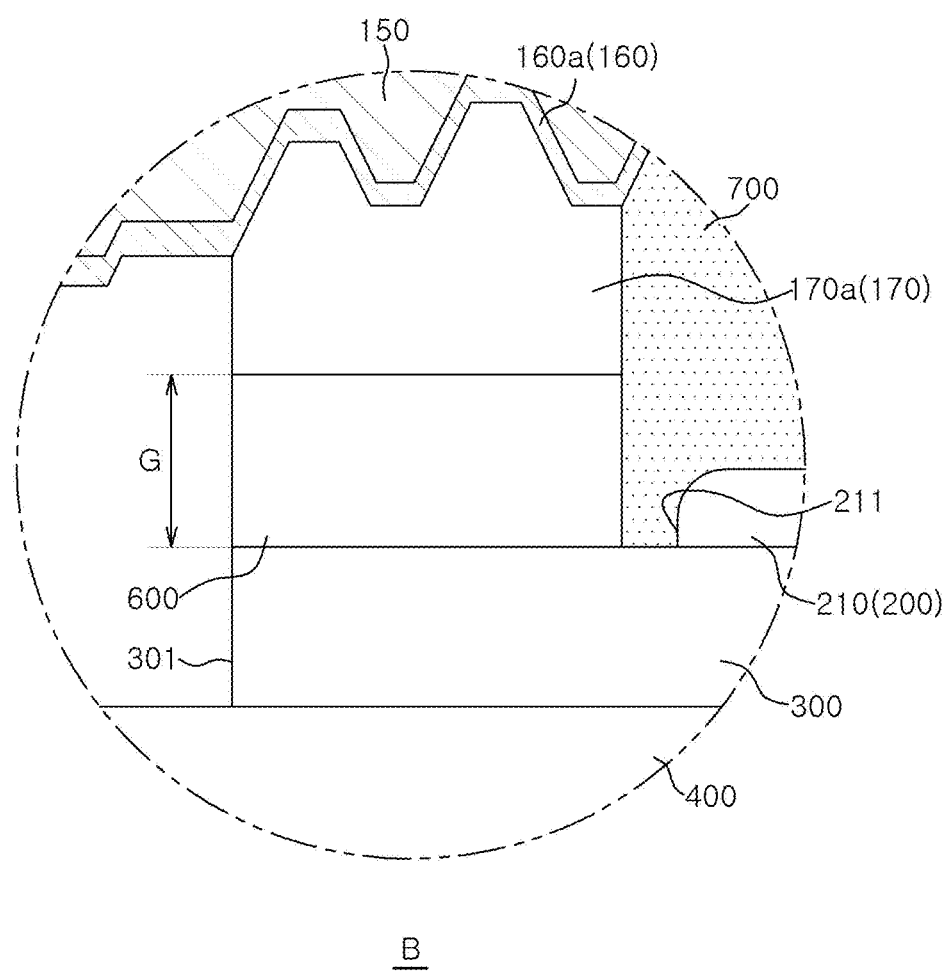
FIG. 5 is an enlarged view of part B of FIG. 2.

Referring to FIGS. 2 and 5, current may flow through the conductive pattern layer 300 and the conductive pattern layer 300 may be electrically connected to the light emitting diode 100. The conductive pattern layer 300 may be disposed on the insulating layer 400 and configured to form a specific pattern. For example, the conductive pattern layer 300 may include at least one of Ag, Cu, Au, Ca, W, Zn, Ni, Fe, Pt, and Sn. In addition, the conductive pattern layer 300 may have a thickness of 10 µm to 150 µm inclusive.

Meanwhile, a communication hole 301 may be formed in a position corresponding to the through-hole 211 in the conductive pattern layer 300. The communication hole 301 may communicate with the through-hole 211, and the insulating layer 400 may be exposed toward the light emitting diode 100 through the communication hole 301. In other words, the conductive pattern layer 300 may be separated into both sides on the insulating layer 400 and an empty space may be formed therebetween. The communication hole 301 may be formed to have an overlapping region with a region between the first electrode pad 170a and the second electrode pad 170b. The communication hole 301 may have a width of 320 μm or less. A material having a refractive index of 1 or more may be disposed in the communication hole 301, and an air gap may be disposed. Flux included in the solder 600 can be easily volatilized into the air through the communication hole 301 and the through-hole 211. In this case, defects caused by the flux remaining in the solder 600 can be prevented, and for example, the spread of the solder due to the flux remaining in the solder 600 can be prevented. Moreover, it is possible to prevent a non-illumination phenomenon caused by residual flux in the solder 600 and to improve solderability.

Here, the flux is a material that is generally mixed with the solder 600 and assists in good soldering. The flux primarily removes an oxide film on the surface of the naturally oxidized solder 600, and can prevent re-oxidation and form a film during the process. In addition, the flux may increase the spreadability of the solder 600 by reducing the surface tension of the solder 600, which tends to maintain the original shape. A phenomenon in which the solder 600 is dragged during the process may be prevented. For this reason, flux is mixed with solder and processed. However, if the flux remains after the process, it causes problems such as non-lighting and reliability degradation. Therefore, the flux must be volatilized and not be remained so that it does not affect product characteristics and reliability.

The insulating layer 400 may be electrically insulated and may be disposed on the substrate 500. For example, the insulating layer 400 may include one or more of silicon-based, acrylic-based, and ceramic-based materials having excellent heat dissipation performance. The insulating layer 400 may have a thickness of 90 μm to 180 μm inclusive, but is not limited thereto, and may have a thickness of 50 μm or more and 500 μm or less.

The substrate 500 may support the insulating layer 400. For example, the substrate 500 may form a printed circuit board (PCB) together with the insulating layer 400 and the conductive pattern layer 300. In addition, the substrate 500 may include alloy composed of one or more of Cu, Zn, Au, Ni, Al, Mg, Cd, Be, W, Mo, Si, and Fe, or some thereof. However, this is just an example, and the substrate 500 may include one or more of FR1, CEM-1, and FR-4. Here, FR1 is a material in which copper foil and laminated paper are laminated, and CEM-1 is a material in which copper foil, glass fiber fabric, laminated paper, and glass fiber fabric are sequentially laminated. Moreover, FR-4 is a material in which copper foil, and glass fiber fabric or glass fiber fabric are laminated. The substrate 500 may have a thickness of 0.2 mm to 10 mm inclusive.

Referring back to FIG. 2, the solder 600 may fix the light emitting diode 100 in a predetermined position. One side of the solder 600 is connected to the electrode layer 170 and the other side is connected to the conductive pattern layer 300. In this case, the solder 600 may electrically connect the electrode layer 170 and the conductive pattern layer 300. A plurality of solders 600 may be provided, and the plurality of solders 600 may be respectively connected to the first electrode pad 170a and the second electrode pad 170b. In addition, the plurality of solders 600 may be spaced apart from each other to prevent a short circuit from occurring between the first electrode pad 170a and the second electrode pad 170b. In this case, the flux may be volatilized into the space between the plurality of solders 600.

Meanwhile, the solder 600 may have a thickness in the up-down direction and may be formed to a thickness of 100 μm or less. For example, when the size of the light emitting diode 100 is 500 μm² or less, the solder 600 may have a thickness of 5 μm to 50 μm inclusive. However, this is only an example, and the present disclosure is not limited thereto. Accordingly, the thickness of the solder 600 may have various thicknesses depending on the size of the light emitting diode 100. In addition, the solder 600 may be disposed in the through-hole 211, and the side surface thereof may be partially supported by the first cover part 210.

On the other hand, the solder 600 directly contacts the electrode layer 170, and even a slight change has a great influence on a process defect rate and characteristics of the product. When the amount of solder 600 is increased compared to the electrode layer 170, the probability of occurrence of solder balls may be increased, thereby increasing the rate of short circuits between light emitting diode chips. In addition, the solder 600 interferes with self-alignment on the reflow which lowers work efficiency, and reduces solder spreadability so that the defect rate is increased. After the electrode layer 170 is bonded to the solder 600, the deterioration in solder spreadability results in a shape in which the middle portion is concave due to the viscosity of the characteristics of the solder 600. Such a shape reduces a junction width through which the light emitting diode 100 can be stably bonded to the solder 600, and may cause tilting and lifting of the light emitting diode 100. In addition, the probability of occurrence of cracks in the solder 600 is increased, and thermal conductivity is reduced, resulting in degradation of product characteristics and reliability.

The molding part 700 may protect the light emitting diode 100, and may improve light extraction efficiency of the light emitting diode 100. In addition, the molding part 700 may encapsulate the light emitting diode 100, and may refract light emitted from the light emitting diode 100. Further, the molding part 700 may be a light-transmitting transparent molding for transmitting light emitted from the light emitting diode 100. For example, the molding part may be formed of a resin containing at least one of silicone series, epoxy series, polymethyl methacrylate (PMMA) series, polyethylene (PE) series, and polystyrene (PS) series. Furthermore, the molding part 700 may be formed of fluorine resin to improve light efficiency emitted from the light emitting diode 100.

Meanwhile, the molding part 700 may include a light diffusion material capable of diffusing light emitted from the light emitting diode 100. For example, the light diffusion material may include one or more of $TiO_2$, $BaO$, $SiO_2$, $MgO$, and $Y_2O_3$ capable of scattering light, and may be distributed inside the molding part 700. In addition, the molding part 700 may include a wavelength conversion material capable of converting a wavelength of light emitted from the light emitting diode 100. For example, the wavelength conversion material may include a phosphor capable of emitting at least one of red light, blue light, and green light, and may be distributed inside the molding part 700.

Meanwhile, the solder 600 is shown as having both sides symmetrical to each other and extending in the up-down direction, but this is only an example and the present disclosure is not limited thereto. Accordingly, according to a modified example of the first embodiment of the present disclosure, both side surfaces of the solder 600 may be provided to be asymmetrical to each other, and one side surface may extend in a direction different from the horizontal direction.

Figure 6:
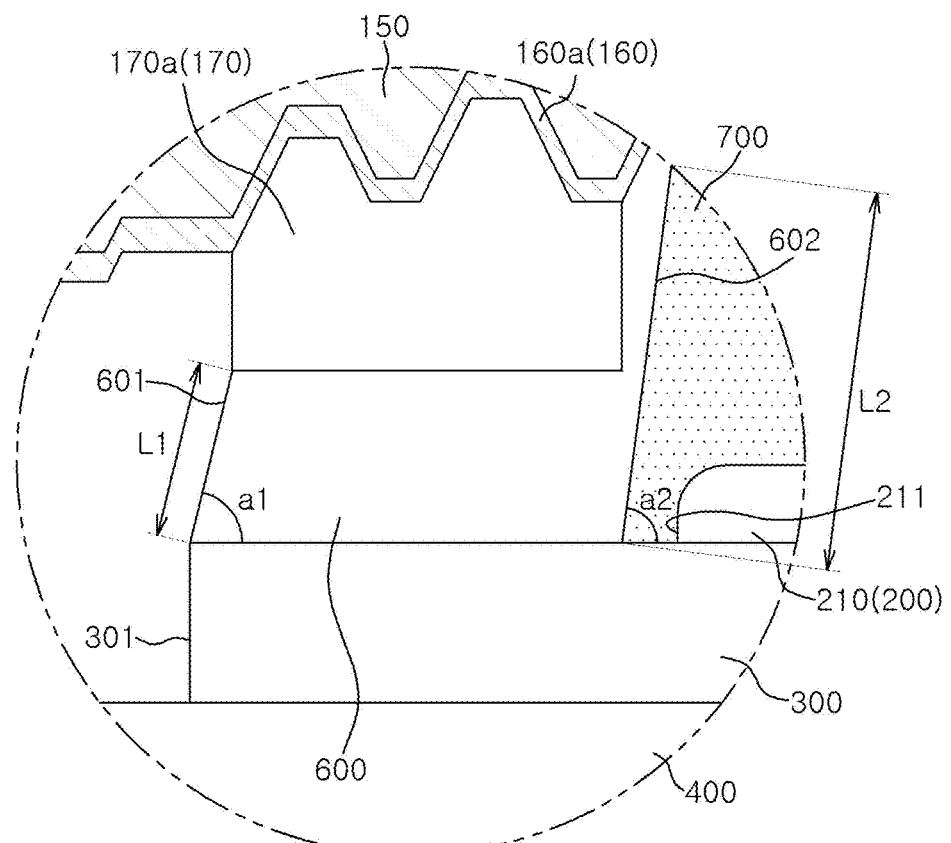
FIG. 6 is an enlarged view according to a modified example of part B of FIG. 2.

Referring to FIG. 6, one side of the solder 600 may extend to be inclined with respect to the horizontal direction. The upper and lower surfaces of the solder 600 may be formed to have different widths. The lower surface of the solder 600 may have a greater width than the upper surface of the solder. The solder 600 may have a first solder side surface 601 and a second solder side surface 602 formed on opposite sides of the solder 600. Here, the first solder side surface 601 may be closer to the communication hole 301 than the second solder side surface 602, and the second solder side surface 602 may be closer to the first cover part 210 than the first solder side surface 601.

The both side surfaces of the solder 600 have different angles, and the solder 600 may be formed to extend between the light emitting diode 100 and the conductive pattern layer 300. For example, the first solder side surface 601 may be extended to be inclined with respect to the conductive pattern layer 300 at a first angle α1 with respect to the conductive pattern layer 300. For example, the first angle α1 may be 60° to 90° inclusive. In addition, the second solder side surface 602 may be extended to be inclined with respect to the conductive pattern layer 300 at a second angle α2 with respect to the conductive pattern layer 300. For example, the second angle α2 may be 30° to 70° inclusive. The first solder side surface 601 and the second solder side surface 602 may extend so that the first angle α1 and the second angle α2 are different from each other.

In addition, the first solder side surface 601 and the second solder side surface 602 may be formed to have different lengths. For example, a first length L1 of the first solder side surface 601 may be shorter than a second length L2 of the second solder side surface 602. The second solder side surface 602 may surround the side surface of the electrode layer 170 of the light emitting diode 100 to extend to contact the insulation layer 150. In this case, the second length L2 may be longer than the first length L1 by the thickness of the electrode layer 170. Moreover, a width of at least one of the upper and lower surfaces of the solder 600 may be wider than that of the electrode layer 170.

Meanwhile, although the first solder side surface 601 and the second solder side surface 602 are shown to have a constant slope, this is only an example and the present disclosure is not limited thereto. Accordingly, according to another modified example of the first embodiment of the present disclosure, the side surfaces of the solder 600 may be extended such that a portion and the other portion have different slopes.

Figure 7:
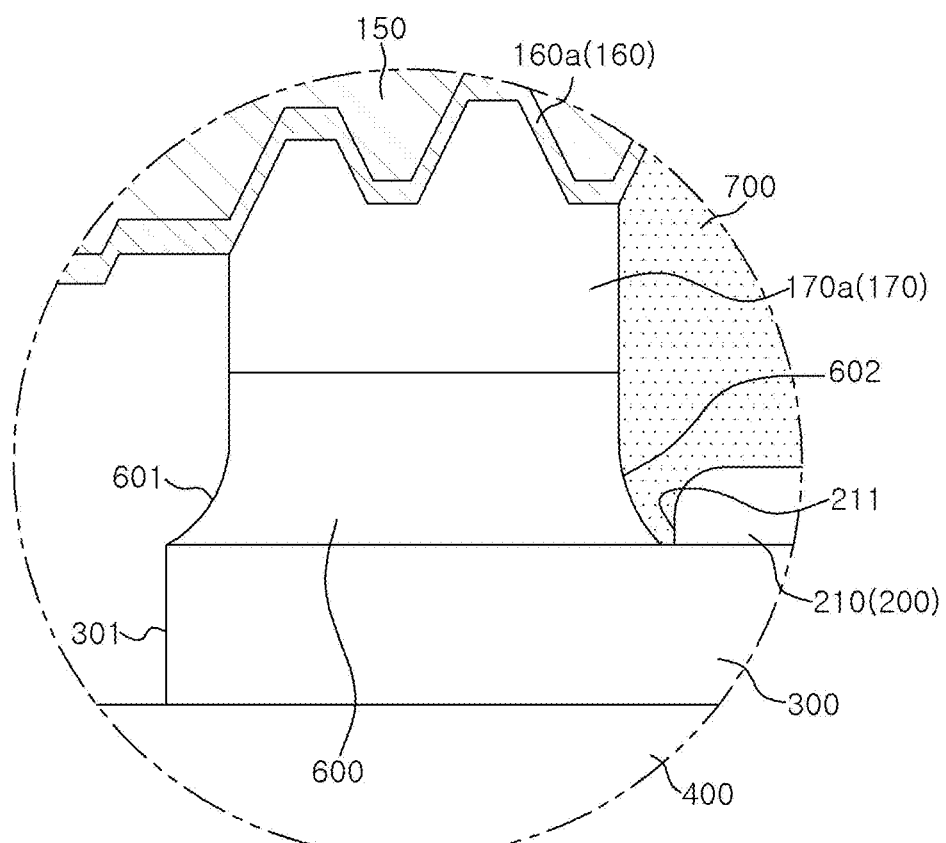
FIG. 7 is an enlarged view according to another modified example of part B of FIG. 2.

Referring to FIG. 7, the second solder side surface 602 may extend so that the slope of a portion is different from that of the other portion. For example, a portion adjacent to the electrode layer 170 may extend in the up-down direction, and a portion adjacent to the conductive pattern layer 300 may extend to have a predetermined curvature. In this case, the width of the solder 600 may be changed based on the portions having the different side slopes. In addition, the second solder side surface 602 may extend toward the cover layer 200 as it goes from the upper surface to the lower surface. In other words, the second solder side surface 602 may be extended such that the width of the solder 600 increases as it goes from the upper surface to the lower surface. In this case, it is possible to prevent a short circuit from occurring in the light emitting diode 100, and the reliability of the light emitting diode 100 can be improved by increasing the bonding area between the solder 600 and the electrode layer 170 or between the solder 600 and the conductive pattern layer 300.

Meanwhile, although the first solder side surface 601 and the second solder side surface 602 are shown as having a linear region, but this is only an example and the present disclosure is not limited thereto. Accordingly, according to still another modified example of the first embodiment of the present disclosure, at least one of the first solder side surface 601 and the second solder side surface 602 of the solder 600 may be curved to have a predetermined curvature.

Figure 8:
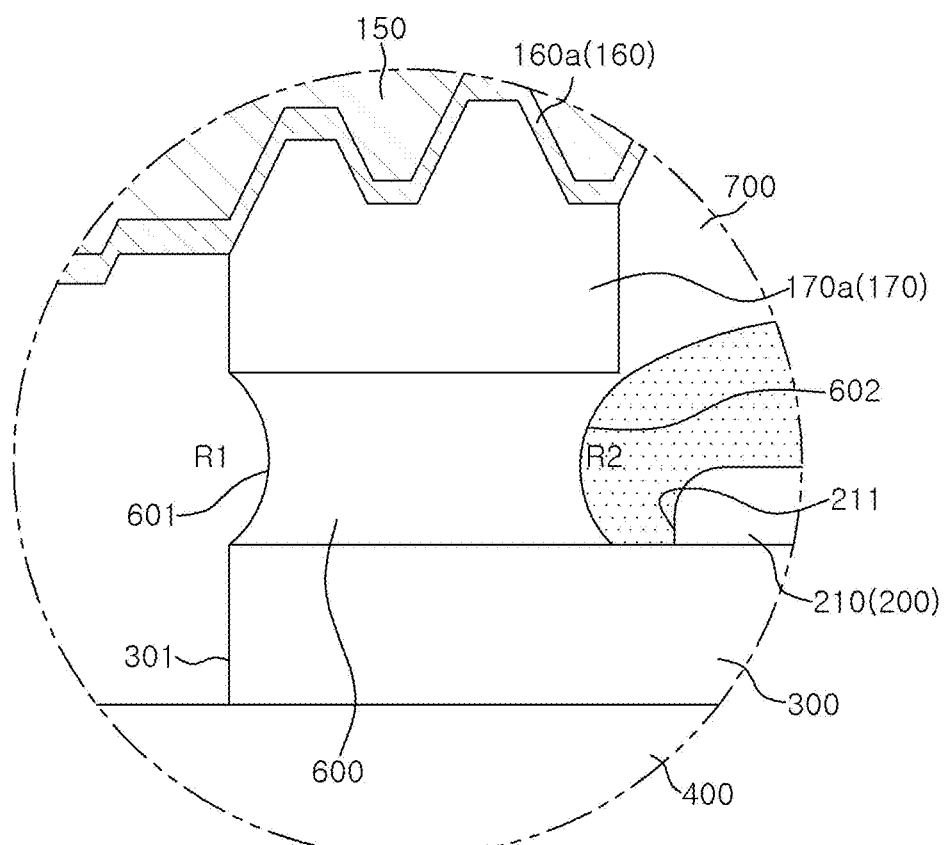
FIG. 8 is an enlarged view according to still another modified example of part B of FIG. 2.

Referring to FIG. 8, the first solder side surface 601 and the second solder side surface 602 may be formed to be concave toward the inside of the solder 600, and the first solder side surface 601 and the second solder side surface 602 may be formed to have different curvatures. For example, a curvature radius R1 of the first solder side surface 601 may be greater than a curvature radius of the second solder side surface 602, and a curvature of the second solder side surface 602 may be smaller than that of the first solder side surface 601. In this case, it is possible to prevent a short circuit from occurring in the light emitting diode 100, and the reliability of the light emitting diode 100 can be improved by increasing the bonding area between the solder 600 and the electrode layer 170 and between the solder 600 and the conductive pattern layer 300.

Meanwhile, although the solder 600 is shown to be disposed on the conductive pattern layer 300, but this is only an example and the present disclosure is not limited thereto. Accordingly, according to still another modified example of the first embodiment of the present disclosure, the solder 600 may be disposed inside the communication hole 301 of the conductive pattern layer 300.

Figure 9:
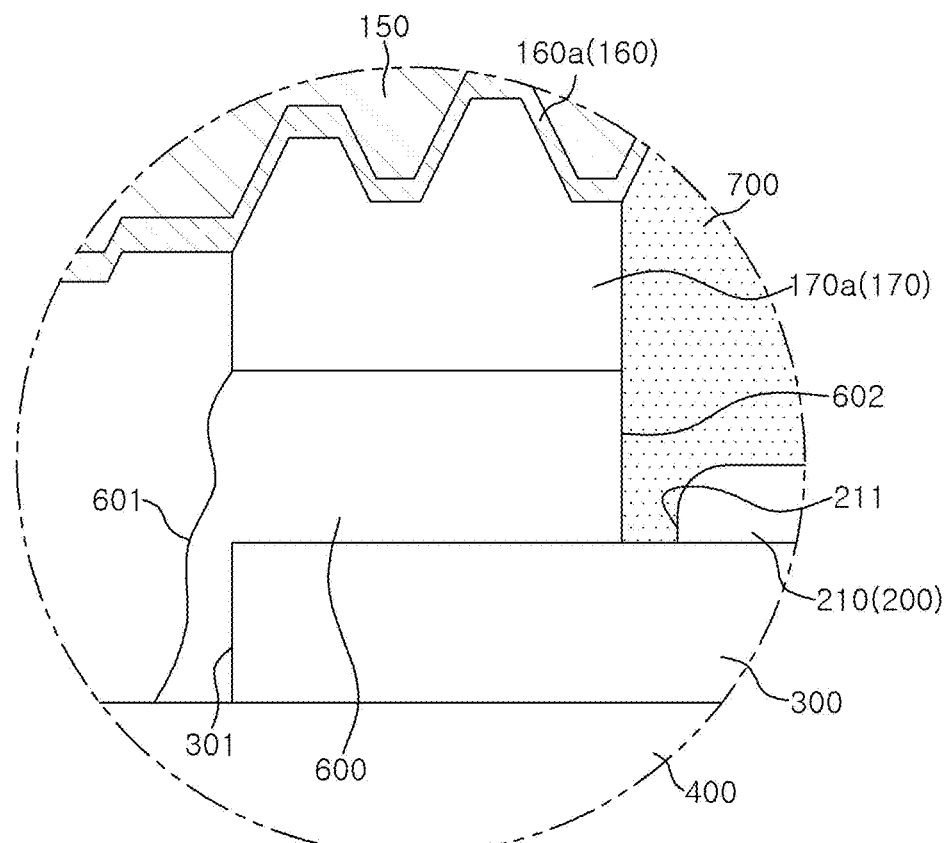
FIG. 9 is an enlarged view according to still another modified example of part B of FIG. 2.

Referring to FIG. 9, the first solder side surface 601 may extend from the electrode layer 170 toward the inside of the communication hole 301. In addition, at least a portion of the solder 600 may be disposed inside the communication hole 310 and supported by the insulating layer 400. In this case, the reliability of the light emitting diode 100 can be improved by increasing the bonding area between the solder 600 and the conductive pattern layer 300.

In the light emitting diode module 1 according to the first embodiment of the present disclosure, the first cover part 210 and the second cover part 220 form the step 230, and the gap G between the electrode layer 170 and the conductive pattern layer 300 is minimized as much as the height of the formed step 230. In this case, the spreadability of the solder 600 can be improved as the gap G between the electrode layer 170 and the conductive pattern layer 300 is minimized.

In addition, since the amount of solder 600 is minimized, generation of solder balls can be prevented, and short circuits between the electrode layers 170 of the light emitting diode 100 can be prevented. When the spreadability of the solder 600 is improved, the contact area with the electrode layer 170 can be increased, the electrode layer 170 can be stably bonded to the conductive pattern layer 300, and the occurrence of cracks can be prevented.

Moreover, the increased contact area between the electrode layer 170 and the solder 600 can prevent the light emitting diode 100 from tilting and lifting, and thermal conductivity can be improved.

Meanwhile, in addition to such configurations, according to the second embodiment of the present disclosure, the cover layer 200 may include a first cover part 210 and a second cover part 220. Hereinafter, with further reference to FIG. 10, a second embodiment of the present disclosure will be described. In the description of the second embodiment, the differences compared with the above-described embodiment are mainly described, and the same description and reference numerals are referred to the above-described embodiment. The first cover part 210 and the second cover part 220 of the second embodiment are the same as the first cover part 210 and the second cover part 220 of FIG. 2 except for the shapes thereof.

Figure 10:
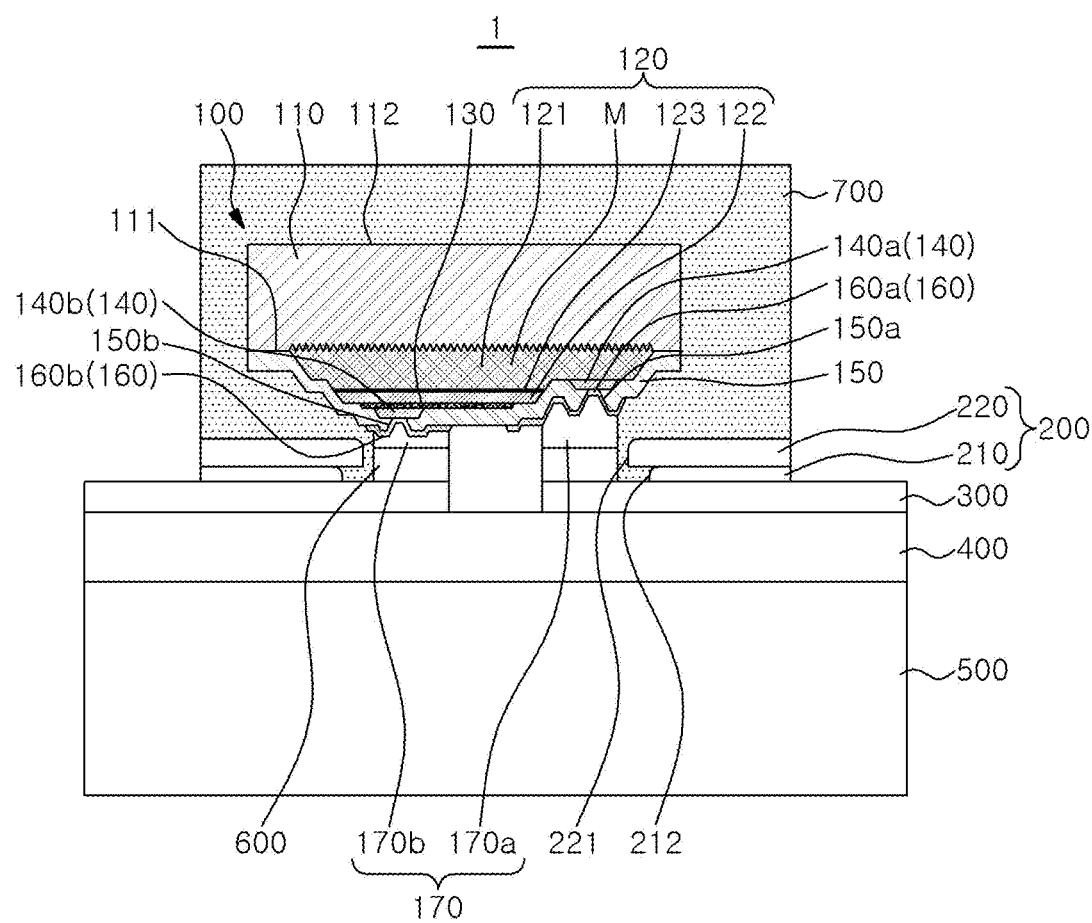
FIG. 10 is a view showing a light emitting diode module according to a second embodiment of the present disclosure.

Referring to FIG. 10, the first cover part 210 may be disposed on the conductive pattern layer 300. The first cover part 210 may have a predetermined thickness, for example, a thickness of 10 µm to 50 µm inclusive. In addition, when viewed from above the light emitting diode 100, the first cover part 210 may be disposed so that at least a portion thereof overlaps with the light emitting diode 100. For example, at least a portion of the first cover part 210 may be disposed below the light emitting diode 100. Here, the portion of the first cover part 210 disposed below the light emitting diode 100 may be defined as an overlapping region of the first cover part 210. The overlapping region of the first cover part 210 may be smaller than an overlapping region of the second cover part 220 to be described later. However, this is just an example, and the first cover part 210 may be disposed on the conductive pattern layer 300 so as not to overlap with the light emitting diode 100 when viewed from above.

A first through-hole 212 exposing the conductive pattern layer 300 toward the light emitting diode 100 may be formed in the first cover part 210. The first through-hole 212 may be formed in a central portion of the first cover part 210. For example, a width of the first through-hole 212 may be greater than or equal to 150 µm to 1000 µm inclusive. In addition, the electrode layer 170 may be disposed directly above the first through-hole 212, and the solder 600 may be disposed within the first through-hole 212.

The second cover part 220 may be disposed on the first cover part 210. The second cover part 220 may have a thickness equal to or greater than that of the first cover part 210. For example, the second cover part 220 may have a thickness of 10 µm to 50 µm inclusive. In addition, when viewed from above the light emitting diode 100, the second cover part 220 may be disposed so that at least a portion thereof overlaps with the light emitting diode 100. For example, at least a portion of the second cover part 220 may be disposed below the light emitting diode 100. In this case, the portion of the second cover part 220 disposed below the light emitting diode 100 may be defined as an overlapping region of the second cover part 220. The overlapping region of the second cover part 220 may be placed in a region between the outer periphery of the light transmitting layer 110 of the light emitting diode 100 and the outer periphery of the first conductivity-type semiconductor layer 121. Further, the overlapping region of the second cover part 220 may be placed in a region between the outer periphery of the light transmitting layer 110 of the light emitting diode 100 and the electrode layer 170, and an outer periphery of the overlapping region of the second cover part 220 may be positioned adjacent to an edge of the electrode layer 170. The second cover part 220 may extend so that its outer surface thereof is in contact with the outer edge of the molding part 700 while its inner surface forming a second through-hole 221 to be described later is placed below the light emitting diode 100.

The second through-hole 221 exposing the conductive pattern layer 300 toward the light emitting diode 100 may be formed in the second cover part 220. The second through-hole 221 may be formed in a central portion of the second cover part 220. For example, a width of the second through-hole 221 may be 150 µm to 800 µm inclusive, and the width of the second through-hole 221 may be smaller than that of the first through hole 212. In addition, the electrode layer 170 may be disposed inside or directly above the second through-hole 221, and the solder 600 may be disposed within the second through-hole 221. In this case, the second cover part 220 can prevent the solder 600 from spreading. In other words, when the solder 600 is disposed within the second through-hole 221, the second cover part 210 can support the side surfaces of the solder 600.

The conductive pattern layer 300 may support the first cover part 210 and the second cover part 220. A communication hole 301 may be formed in the conductive pattern layer 300. The communication hole 301 may communicate with the first through-hole 212 and the second through-hole 221, and the insulating layer 400 may be exposed toward the light emitting diode 100 through the communication hole 301.

Figure 11:
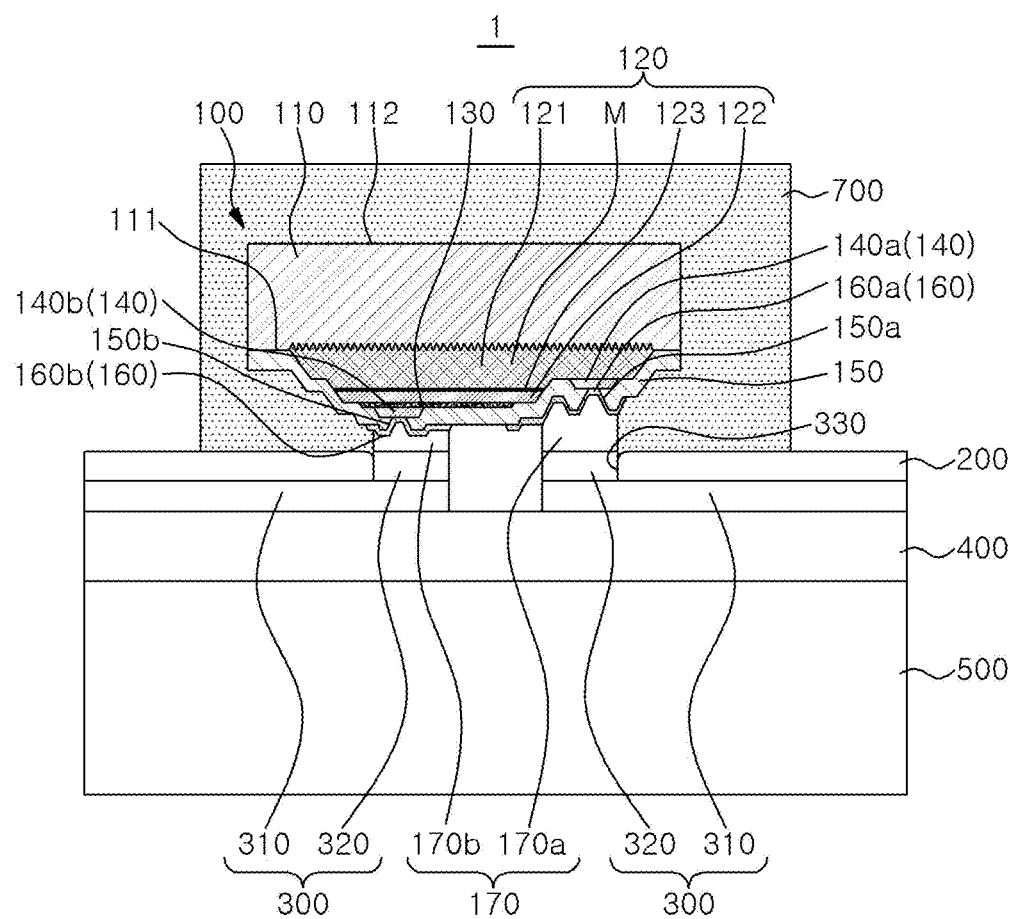
FIG. 11 is a view showing a light emitting diode module according to a third embodiment of the present disclosure.
Figure 12:
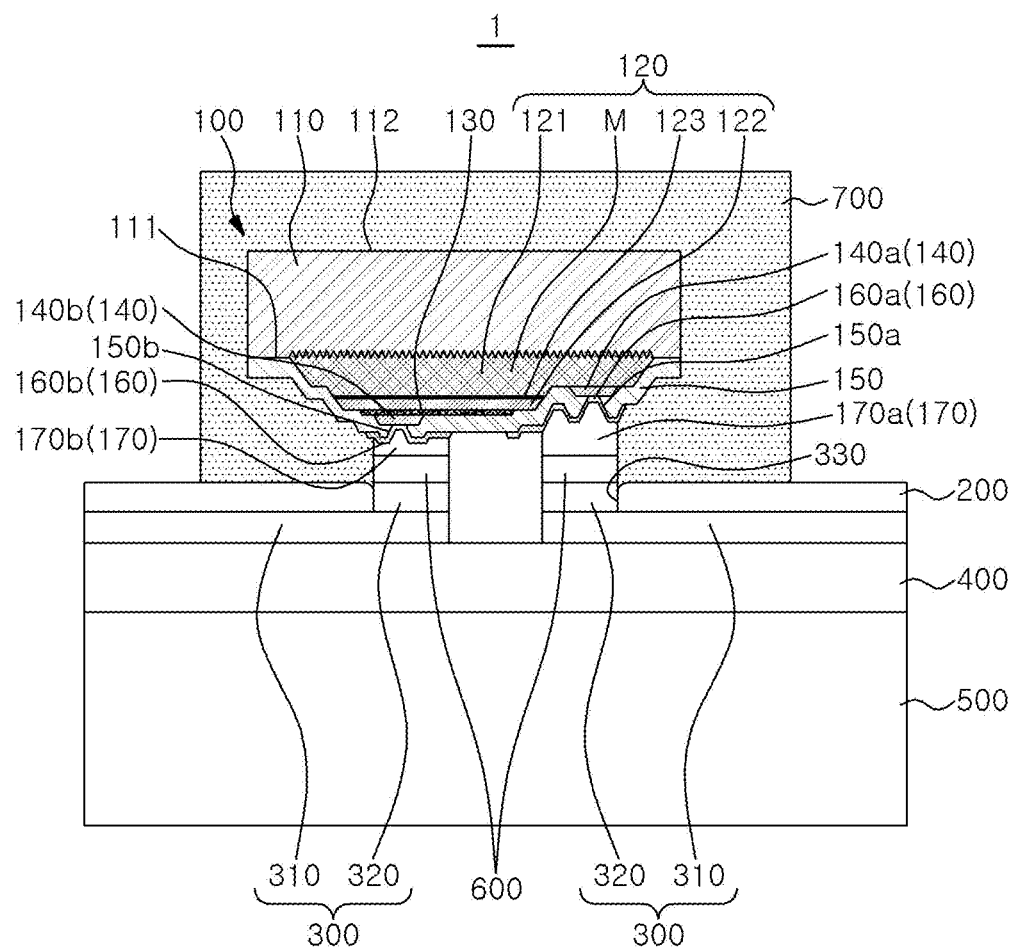
FIG. 12 is a view showing a state in which solder is further included in the light emitting diode module of FIG. 11.

Meanwhile, in addition to such configurations, according to a third embodiment of the present disclosure, the conductive pattern layer 300 may include a first conductive layer 310 and a second conductive layer 320. Hereinafter, the third embodiment of the present disclosure will be described with further reference to FIGS. 11 and 12.

The first conductive layer 310 may be disposed on the insulating layer 400 and the second conductive layer 320 may be disposed on the first conductive layer 310. The second conductive layer 320 may be electrically connected to the first conductive layer 310. In addition, the electrode layer 170 may be disposed on the second conductive layer 320. The first conductive layer 310 and the second conductive layer 320 may form a conductive layer step 330. For example, when viewed from above in a state in which the cover layer 200 is formed on the first conductive layer 310, the second conductive layer 320 may be formed on a region of the upper surface of the first conductive layer 310 where the cover layer 200 is not formed.

For example, the second conductive layer 320 may be formed on the first conductive layer 310 through a surface plating process. As a more detailed example, the second conductive layer 320 may be formed on the first conductive layer 310 through electroplating. In this case, the electroplating is a surface treatment technology which forms metal and non-metal coating layers by immersing a specimen (reduction electrode) and an anode (oxidation electrode) in a plating solution in which metal ions are dissolved and inducing an electrochemical reduction reaction on the surface of the specimen by applying an overpotential of a certain level or above. The second conductive layer 320 may be formed through one or more plating processes of copper plating, chrome plating, gold plating, platinum plating, silver plating, palladium plating, zinc plating, cadmium plating, TIN plating, rhodium plating, silver plating, and nickel plating. However, this is just an example, and the second conductive layer 320 may be formed as a metallic conductor by electroless plating. Further, the size of the second conductive layer 320 may be equal to or larger than that of the electrode layer 170.

Meanwhile, when viewed from above, the cover layer 200 may be disposed on the first conductive layer 310 so as not to overlap with the second conductive layer 320. When the cover layer 200 is laminated on the conductive pattern layer 300, the cover layer 200 may be laminated such that some region of the cover layer 200 is removed and the conductive pattern layer 300 may be exposed through the removed region. In addition, the conductive pattern layer 300 may be electrically connected to the light emitting diode 100 through the removed region of the cover layer 200. The cover layer 200 may be provided such that a difference between the thickness of the second conductive layer 320 and the thickness of the cover layer 200 is within a predetermined range. For example, the cover layer 200 may be provided to have the same thickness as the second conductive layer 320. In this case, the upper surface of the second conductive layer 320 and the upper surface of the cover layer 200 may form a continuous surface without forming a step. However, this is just an example, and the cover layer 200 may have a different thickness from that of the second conductive layer 320. In this case, a step may be formed between the cover layer 200 and the second conductive layer 320. In other words, the step may be formed due to process errors during the process of forming the second conductive layer 320. When the cover layer 200 has a greater thickness than the second conductive layer 320, the cover layer 200 may prevent the electrode layer 170 from being separated from the second conductive layer 320. In addition, the step may be formed within a range where no gap between the electrode layer 170 and the second conductive layer 320 is formed. The height of the step may be equal to or smaller than the thickness of the electrode layer 170 so that the electrode layer 170 is not separated from the second conductive layer 320. As another example, when the height of the step between the cover layer 200 and the second conductive layer 320 is greater than the thickness of the electrode layer 170, the light transmitting layer 110 is supported by the cover layer 200 and a gap is formed between the electrode layer 170 and the second conductive layer 320. In other words, both end corners of the light transmission layer 110 may be caught on the cover layer 200.

The light emitting diode 100 may be electrically connected to the second conductive layer 320. The light emitting diode 100 may be disposed on the electrode layer 170 and the second conductive layer 320, and may be connected to the electrode layer 170 and the second conductive layer 320. In addition, an area of the electrode layer 170 may be equal to or smaller than that of the second conductive layer 320. For example, the light emitting diode 100 may be electrically connected to an external component through flip chip bonding. However, this is just an example, and for the light emitting diode 100, not only flip-chip bonding, but also known technology may be used as long as the solder 600 and the electrode layer 170 can be connected.

Meanwhile, the solder 600 may be disposed between the second conductive layer 320 and the electrode layer 170. In other words, the solder 600 may be applied only to the second conductive layer 320 through a metal mask operation and process for applying solder cream that electrically connects the second conductive layer 320 and the electrode layer 170. The solder 600 may bond the second conductive layer 320 and the electrode layer 170. When the solder 600 is applied in a state where there is no step between the second conductive layer 320 and the electrode layer 170, it is possible to easily adjust the amount of solder 600, and prevent the amount of solder 600 from increasing due to the step. In addition, since an increase in the amount of the solder 600 can be prevented, the ratio of the amount of the solder 600 to the size of the electrode layer 170 can be optimized to form the thickness of the solder 600. In addition, since an increase in the amount of solder 600 can be prevented, cost can be reduced.

In addition, the solder 600 may have a thickness in the up-down direction, and for example, when the size of the light emitting diode 100 is 500 $\mu m^2$ or less, the solder 600 may have a thickness of 5 $\mu m$ to 15 $\mu m$ inclusive. However, this is only an example, and the present disclosure is not limited thereto. Accordingly, the thickness of the solder 600 may have various thicknesses depending on the size of the light emitting diode 100. Although the side surface of the solder 600 according to the third embodiment is illustrated as extending in the up-down direction, this is only an example and thus, the present disclosure is not limited thereto. Accordingly, the solder 600 according to the third embodiment may be provided in various forms as in the modified examples of the first embodiment.

As such, the light emitting diode module 1 according to the third embodiment can minimize the amount of solder 600 provided between the electrode layer 170 and the second conductive layer 320 by minimizing the step formed between the cover layer 200 and the second conductive layer 320. In this case, even when the light emitting diode 100 is miniaturized, it is possible to bond the light emitting diode 100 at a correct position of the substrate 500 by minimizing the amount of solder 600.

In addition, since the amount of the solder 600 is minimized, generation of solder balls can be prevented, and a short circuit between the electrode layers 170 of the light emitting diode 100 can be prevented.

In addition, it is possible to improve the defect rate by increasing the self-align work efficiency on the reflow and improving the solder spreadability. Further, by improving the spreadability of the solder 600, the contact area between the solder 600 and each of the electrode layer 170 and the second conductive layer 320 can be increased, the electrode layer 170 can be stably bonded to the conductive pattern layer 300, and cracks can be prevented from occurring.

Furthermore, the increased contact area between the electrode layer 170 and the solder 600 can prevent the light emitting diode 100 from tilting and lifting, and thermal conductivity can be improved, thereby improving product characteristics and reliability.

Meanwhile, as the step between the second conductive layer 320 and the cover layer 200 is minimized, the exposed area of the solder 600 to the outside increases. In this case, the flux included in the solder 600 can be easily volatilized into the air. In other words, as the exposed area of the solder 600 increases, the path through which the flux included in the solder 600 can volatilize may increase. Moreover, defects caused by flux remaining in the solder 600 can be prevented, and for example, it is possible to prevent the spread of the solder due to the flux remaining in the solder 600.

In addition, it is possible to prevent a non-illumination phenomenon caused by the residual flux in the solder 600, and solderability can be improved.

Figure 13:
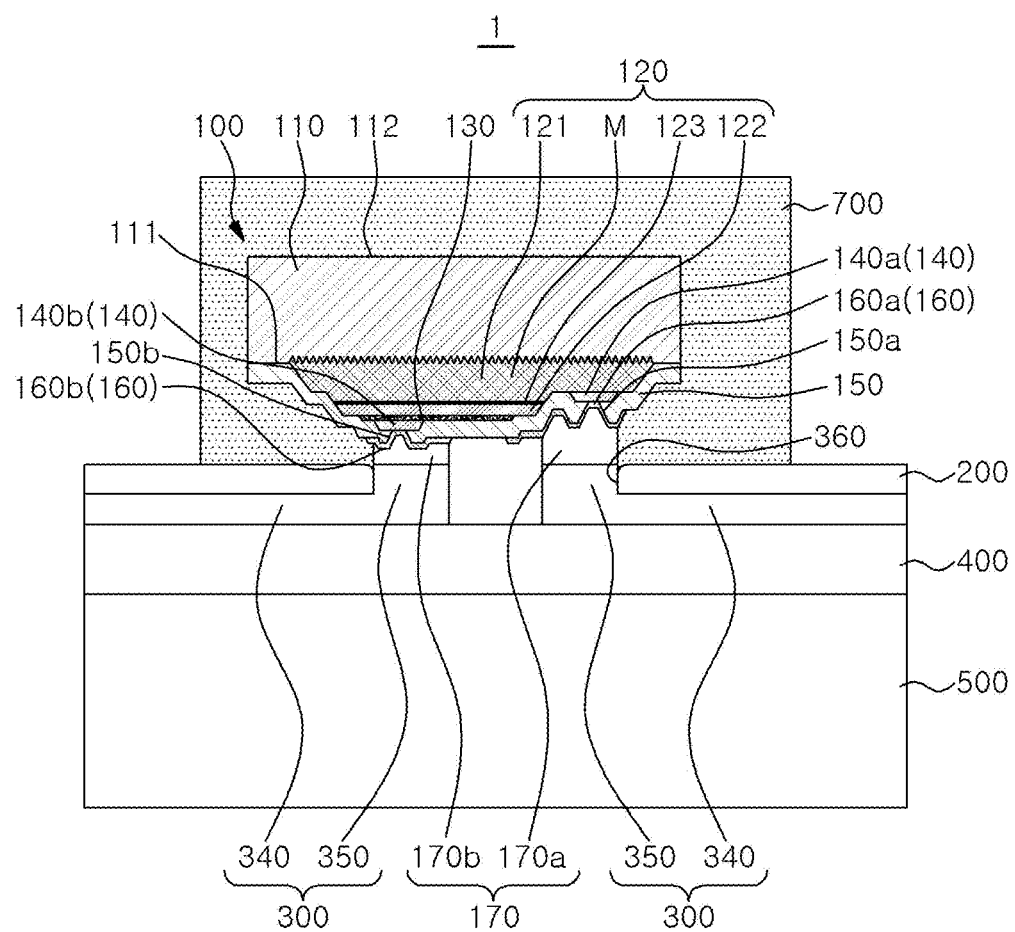
FIG. 13 is a view showing a light emitting diode module according to a fourth embodiment of the present disclosure.
Figure 14:
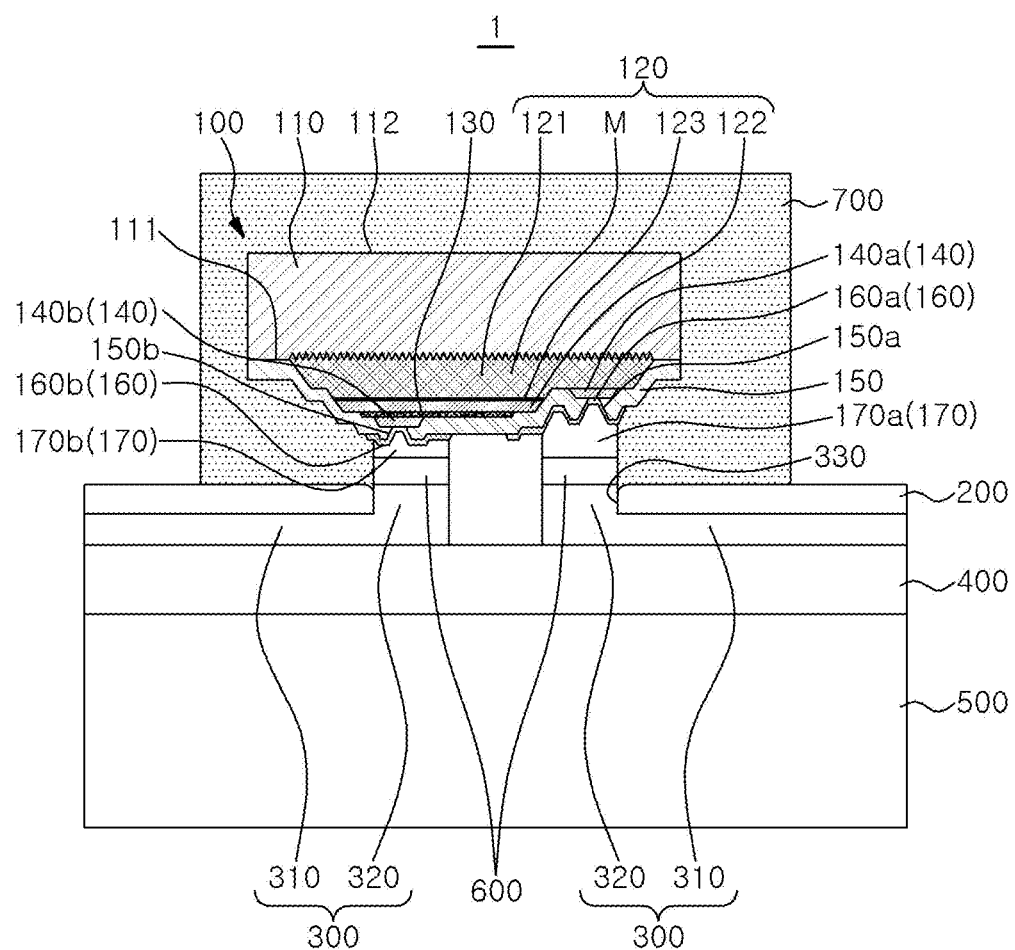
FIG. 14 is a view showing a state in which solder is further included in the light emitting diode module of FIG. 13.

Meanwhile, in addition to such configurations, according to a fourth embodiment of the present disclosure, the conductive pattern layer 300 may include a first conductive part 340 and a second conductive part 350. Hereinafter, the fourth embodiment of the present disclosure will be described with further reference to FIGS. 13 and 14.

The first conductive part 340 may be disposed on the insulating layer 400, and the second conductive part 350 may be disposed on the first conductive part 340. For example, the second conductive part 350 may extend upward from the upper surface of the first conductive part 340 so that a conductive part step 360 is formed between the first conductive part 340 and the second conductive part 350. The first conductive part 340 and the second conductive part 350 may be electrically connected to each other, and may be integrally formed. In addition, the second conductive part 350 may have a greater thickness than the first conductive part 340. In addition, the cover layer 200 may be stacked on the first conductive part 340. The cover layer 200 stacked on the first conductive part 340 may be formed so as not to form a step with the second conductive part 350, but is not limited thereto. In other words, a slight difference may occur between the second conductive part 350 and the cover layer 200 due to a fixed state error. For example, the step between the cover layer 200 and the second conductive part 350 may be formed within a range in which a gap does not occur between the electrode layer 170 and the conductive pattern layer 300. Further, the step between the second conductive part 350 and the cover layer 200 may be equal to or smaller than the thickness of the electrode layer 170. When the step between the second conductive part 350 and the cover layer 200 is formed to be larger than the thickness of the electrode layer 170, both end corners of the light transmitting layer 110 may be caught by the cover layer 200 so that a gap may be formed between the electrode layer 170 and the second conductive part 350.

For example, the step between the second conductive part 350 and the first conductive part 340 may be formed through an etching process. As a more detailed example, when the conductive pattern layer 300 is disposed on the insulating layer 400, a portion of the conductive pattern layer 300 is etched by the thickness of the cover layer 200. In this case, the second conductive part 350 may be formed as thick as the cover layer 200, and the first conductive part 340 may be formed beneath the second conductive part 350. However, this is just an example, and the first conductive part 340 and the second conductive part 350 may be formed by a known method other than etching.

The description of the cover layer 200 and the solder 600 in the fourth embodiment is the same as the description of the cover layer 200 and the solder 600 in the third embodiment, so it will be omitted. Accordingly, the relationship between each of the first conductive part 340 and the second conductive part 350, and the cover layer 200 and the solder 600 in the fourth embodiment may be the same as the relationship between each of the first conductive layer 310 and the second conductive layer 320, and the cover layer 200 and the solder 600 in the third embodiment.

In this way, the light emitting diode module 1 according to the fourth embodiment minimizes the step formed between the cover layer 200 and the second conductive part 350, thereby minimizing the amount of the solder 600 provided between the electrode layer 170 and the second conductive part 350. In this case, even if the light emitting diode 100 is miniaturized, the amount of the solder 600 is minimized, so that the light emitting diode 100 can be bonded to the substrate 500 at an accurate position.

Figure 15:
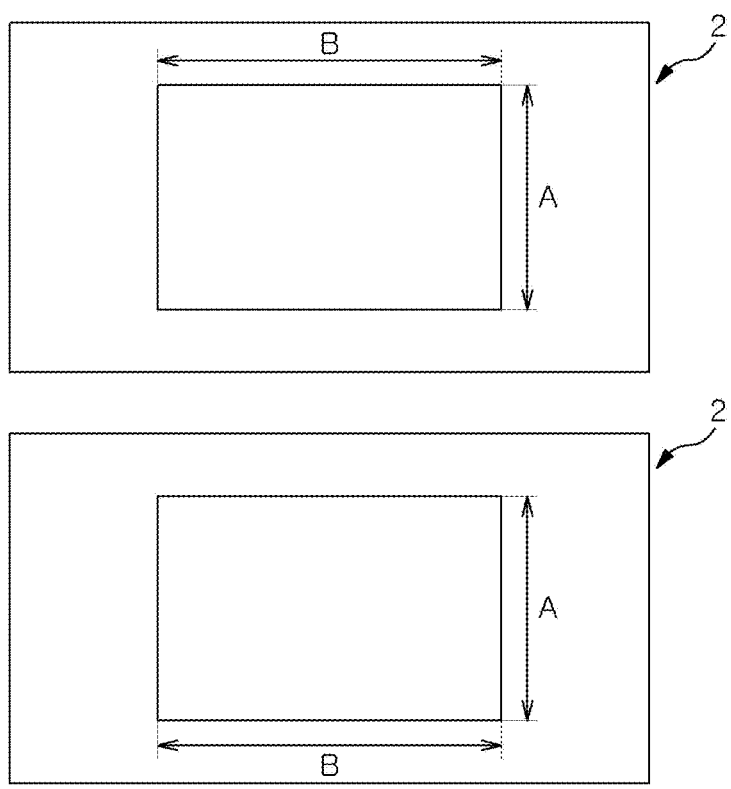
FIG. 15 is a plan view of a first metal mask for applying solder.

Meanwhile, a first metal mask 2 of FIG. 15 is coated with two solders 600 with a size of A×B, and P and N electrodes of the light emitting diode 100 are respectively bonded thereto.

Figure 16:
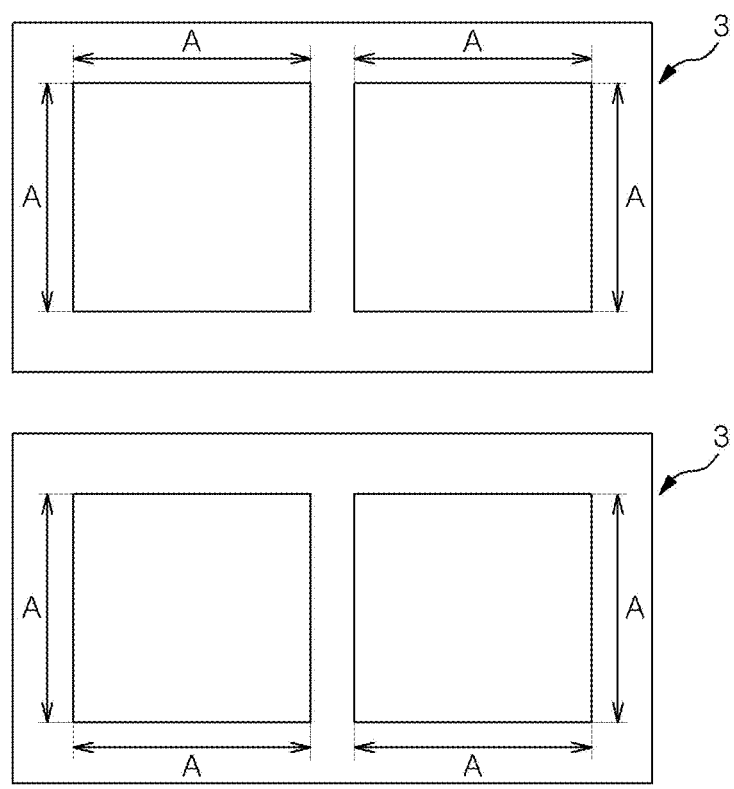
FIG. 16 is a plan view of a second metal mask for applying solder.

In addition, a second metal mask 3 of FIG. 16 is coated with four solders 600 with a size of A×A, and the P electrode of the light emitting diode 100 is bonded to the two solders with the size of A×A, and the N electrode of the light emitting diode 100 is bonded to the remaining two solders with the size of A×A.

Referring to FIG. 15, in the size of the first metal mask 2, the horizontal length B is longer than the vertical length A, and shorter than twice the vertical length A. Further, referring to FIG. 16, in the size of the second metal mask 3, the horizontal length A and the vertical length A are the same.

Accordingly, a larger amount of solder 600 is applied on the same structure when the second metal mask 3 of FIG. 16 is used than when the first metal mask 2 of FIG. 15 is used. Furthermore, when the second metal mask 3 of FIG. 16 is used, the spreadability of the solder 600 is improved since the region where the solder 600 can spread is increased.

Accordingly, when the amount of solder 600 is large in comparison with the size of the electrode layer 170 of the light emitting diode 100, the amount of solder 600 can be adjusted to decrease by using the first metal mask 2 of FIG. 15. In addition, when it is necessary to improve the spreadability of the solder 600 rather than adjusting the amount of the solder 600, the spreadability of the solder 600 can be improved by using the second metal mask 3 of FIG. 16.

Figure 17:
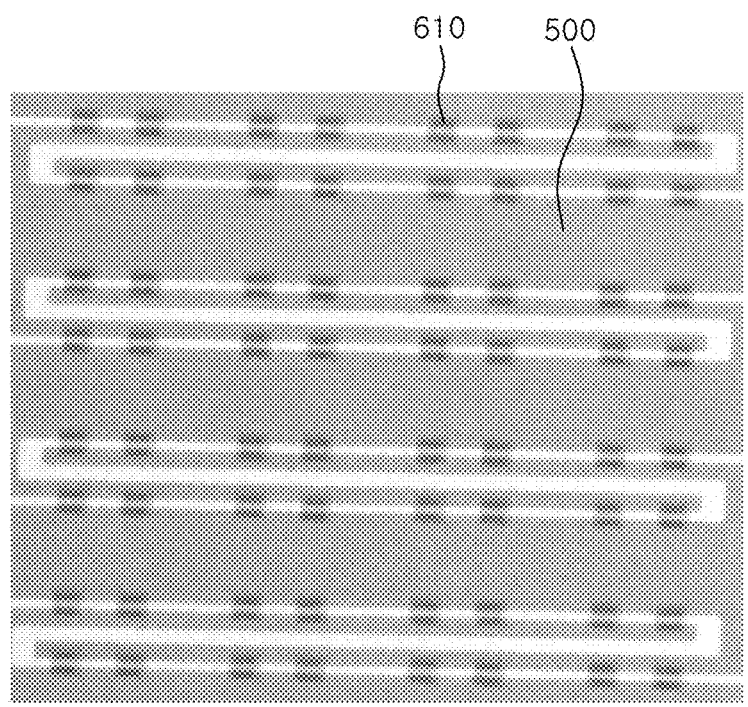
FIG. 17 is an X-ray view of an upper surface of a substrate to which light emitting diodes are bonded after applying solder using the first metal mask in the light emitting diode module according to the first embodiment.
Figure 18:
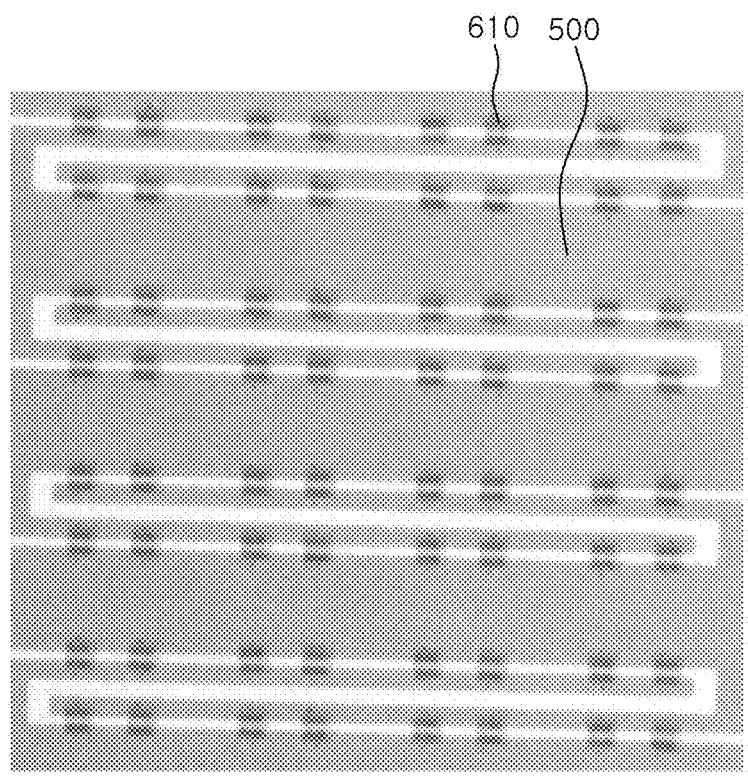
FIG. 18 is an X-ray view of an upper surface of a substrate to which light emitting diodes are bonded after applying solder using the second metal mask in the light emitting diode module according to the first embodiment.

Meanwhile, since the amount of solder 600 according to the first embodiment is applied as much as the thickness of the cover layer 200 compared to the amount of solder 600 in the third or fourth embodiment, the amount of solder 600 may be reduced by using the first metal mask 2 of FIG. 15. In this case, the generation of solder balls 610 can be prevented, thereby reducing the defect rate. Referring to FIGS. 17 and 18, it is possible to compare incidence rates of solder ball 610 depending on the used metal mask.

FIG. 17 is an X-ray view of the upper surface of the substrate 500 to which the light emitting diodes 100 are bonded after applying the solder 600 using the first metal mask 2 of FIG. 15 in the structure of the first embodiment in which the first cover part 210 and the second cover part 220 form the step.

FIG. 18 is an X-ray view of the upper surface of the substrate 500 to which the light emitting diodes 100 are bonded after applying the solder 600 using the second metal mask 3 of FIG. 16 in the structure in which the first cover part 210 and the second cover part 220 form the step.

Referring to FIGS. 17 and 18, it can be seen that the incidence rate of solder balls 610 when the first metal mask 2 of FIG. 15 is used is improved compared to when the second metal mask 3 of FIG. 16 is used.

In the structure of applying the second conductive layer 320 in the third embodiment and the structure of applying the pattern layer 300 including the first conductive part 340 and the second conductive part 350 in the fourth embodiment, they are designed to minimize the amount of solder so that solder spreadability can be further improved by using the second metal mask 3 of FIG. 16.

Figure 19:
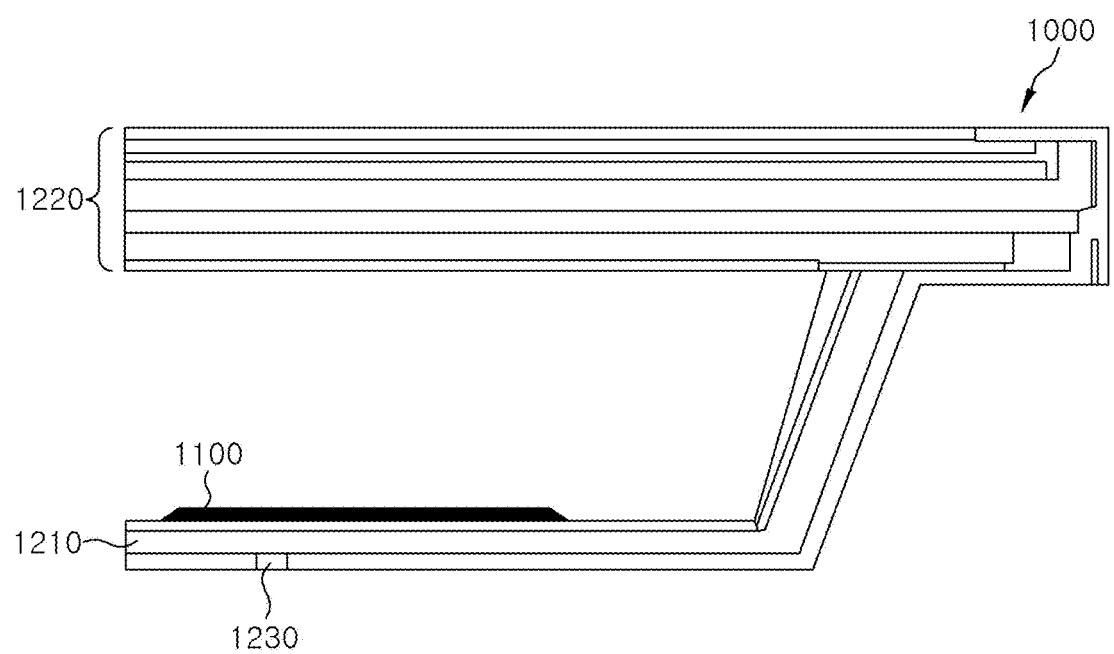
FIG. 19 is a plan view illustrating an example of a display device according to first to fourth embodiments of the present disclosure.

FIG. 19 is a plan view illustrating a display device to which light emitting diode modules according to the first to fourth embodiments of the present disclosure are applied. The display device 1000 may include a light emitting diode module 1100, a frame 1210, an optical unit 1220, and a power supply unit 1230.

The frame 1210 may support the display device 1000 and may have a metal material such as aluminum alloy or a synthetic resin material. Further, the frame 1210 may be spaced apart from the optical unit 1220 by a predetermined distance. The light emitting diode modules 1100 according to the first to fourth embodiments of the present disclosure may be disposed on the frame 1210 to face the optical unit 1220. In this case, the separation distance between the frame 1210 and the optical unit 1220 may be an optical distance (OD) from the light emitting diode module 1100 to the optical unit 1220. At this time, the OD in the present embodiment may be about 1 mm or more and 15 mm or less.

The power supply 1230 may be electrically connected to the light emitting diode module 1100 to supply power to the light emitting diode module 1110. The power supply 1230 may be provided in the frame. The optical unit 1220 is disposed above the frame 1210 and may include a fluorescent sheet, a diffusion plate, an optical sheet, and the like. The display device 1000 of the present embodiment can improve the reliability of the display device by fixing the small-sized light emitting diodes to an accurate position on the circuit board by minimizing the distance between the light emitting diodes of the light emitting diode module 1100 and the circuit board.

The examples of the present disclosure have been described above as specific embodiments, but these are only examples, and the present disclosure is not limited thereto, and should be construed as having the widest scope according to the technical spirit disclosed in the present specification. A person skilled in the art may combine/substitute the disclosed embodiments to implement a pattern of a shape that is not disclosed, but it also does not depart from the scope of the present disclosure. In addition, those skilled in the art can easily change or modify the disclosed embodiments based on the present specification, and it is clear that such changes or modifications also belong to the scope of the present disclosure.

[Explanation of symbols]

| | |
|---|---|
| 1: light emitting diode module | |
| 100: light emitting diode | 110: light transmitting layer |
| 111: light incident surface | 112: light exit surface |
| 120: light emitting structure | 121: first conductivity-type semiconductor layer |
| 122: second conductivity-type semiconductor layer | 123: active layer |
| 130: ohmic layer | 140: contact layer |
| 150: insulation layer | 160: bump layer |
| 170: electrode layer | 200: cover layer |
| 210: first cover part | 211: through-hole |
| 220: second cover part | 230: step |
| 300: conductive pattern layer | 301: communication hole |
| 310: first conductive layer | 320: second conductive layer |
| 330: conductive layer step | 340: first conductive part |
| 350: second conductive part | 360: conductive part step |
| 400: insulating layer | 500: substrate |
| 600: solder | 1000: display device |
| 1100: light emitting diode module | 1210: frame |
| 1220: optical unit | 1230: power supply unit |

What is claimed is:

1. A light emitting diode module, comprising:
a light emitting diode configured to irradiate light;
a conductive pattern layer electrically connected to the light emitting diode; and
a cover layer disposed on the conductive pattern layer and electrically insulated,
wherein the cover layer is disposed between the light emitting diode and the conductive pattern layer to have a region and at least a portion of the cover layer overlaps with the light emitting diode when viewed from above the light emitting diode;
wherein the light emitting diode includes a light transmitting layer, a light emitting structure disposed on the light transmitting layer, and an electrode layer electrically connected to the conductive pattern layer;
wherein the cover layer includes a first cover part and a second cover part disposed on the first cover part forming a step with the first cover part, and wherein the electrode layer is disposed so as not to overlap with the first cover part when viewed from above; and
a solder disposed between the electrode layer and the conductive pattern layer to fix the light emitting diode to the conductive pattern layer,
wherein a through-hole exposing the conductive pattern layer toward the light emitting diode is formed in the first cover part, and
wherein at least a portion of the solder is disposed in the through-hole.

2. The light emitting diode module of claim 1,
wherein the light emitting structure includes a first conductivity-type semiconductor layer, a second conductivity-type semiconductor layer positioned on the first conductivity-type semiconductor layer, and an active layer positioned between the first conductivity-type semiconductor layer and the second conductivity-type semiconductor layer, and
wherein the cover layer is disposed to such that at least a portion of the region overlaps a region between the light transmitting layer and the electrode layer when viewed from above the light emitting diode.

3. The light emitting diode module of claim 2, wherein the cover layer is disposed such that at least a portion of the region overlaps a region between the light transmitting layer and the first conductivity-type semiconductor layer when viewed from above the light emitting diode.

4. The light emitting diode module of claim 1, wherein a roughness of a portion of an upper surface of the first cover part that does not overlap with the second cover part is smaller than a roughness of a lower surface of the first cover part.

5. The light emitting diode module of claim 1, wherein at least one of the first cover part and the second cover part includes a reflective material to reflect light emitted from the light emitting diode.

6. The light emitting diode module of claim 1, wherein at least some of corners of the cover layer have a curved shape.

7. The light emitting diode module of claim 1,
wherein a thickness of the first cover part and a thickness of the second cover part are different from each other.

8. The light emitting diode module of claim 1, wherein the solder has a first solder side surface and a second solder side surface that are formed on opposite sides, and
wherein the first solder side surface and the second solder side surface are inclined with respect to the conductive pattern layer such that angles formed by each of the first solder side surface and the second solder side surface with respect to the conductive pattern layer are different from each other.

9. The light emitting diode module of claim 1, wherein the solder has a first solder side surface and a second solder side surface that are formed on opposite sides, and wherein the first solder side and the second solder side are curved so that curvatures thereof are different from each other.

10. The light emitting diode module of claim 1, wherein a communication hole having a smaller width than the through-hole is formed at a position corresponding to the through-hole in the conductive pattern layer, and
wherein at least a portion of the solder is disposed within the communication hole.

11. The light emitting diode module of claim 1, wherein the conductive pattern layer includes a first conductive layer and a second conductive layer disposed on the first conductive layer, and wherein the electrode layer is disposed on the second conductive layer.

12. The light emitting diode module of claim 11, wherein the cover layer is disposed on the first conductive layer so as not to overlap with the second conductive layer when viewed from above.

13. The light emitting diode module of claim 1, wherein the conductive pattern layer includes a first conductive part, and a second conductive part integrally formed with the first conductive part and extending upward from an upper surface of the first conductive part, and wherein the electrode layer is disposed on the second conductive part.

14. The light emitting diode module of claim 13, wherein the cover layer is disposed on the first conductive part so as not to overlap with the second conductive part when viewed from above.

15. The light emitting diode module of claim 1, wherein when viewed from above, a ratio of an area of an overlapping portion of the light emitting diode and the cover layer to an area of the light emitting diode is 2% to 8% inclusive.

16. The light emitting diode module of claim 1, wherein the cover layer includes a photo solder resist (PSR), and the PSR includes at least one of epoxy, silicone, acrylate, or barium sulfate.

17. A display device, comprising:
a frame:
a light emitting diode module disposed on the frame:
an optical unit disposed above the frame; and
a power supply configured to supply power to the light emitting diode module,
wherein the light emitting diode module includes:
a light emitting diode configured to irradiate light;
a conductive pattern layer electrically connected to the light emitting diode; and
a cover layer disposed on the conductive pattern layer and electrically insulated, and
wherein the cover layer is disposed between the light emitting diode and the conductive pattern layer so that at least a portion of the cover layer has a region overlapping with the light emitting diode;
wherein the light emitting diode includes a light transmitting layer, a light emitting structure disposed on the light transmitting layer, and an electrode layer electrically connected to the conductive pattern layer;
wherein the cover layer includes a first cover part and a second cover part disposed on the first cover part forming a step with the first cover part, and wherein the electrode layer is disposed so as not to overlap with the first cover part when viewed from above; and
a solder disposed between the electrode layer and the conductive pattern layer to fix the light emitting diode to the conductive pattern layer,
wherein a through-hole exposing the conductive pattern layer toward the light emitting diode is formed in the first cover part, and
wherein at least a portion of the solder is disposed in the through-hole.

* * * * *